United States Patent
Oono et al.

(10) Patent No.: US 7,150,569 B2
(45) Date of Patent: Dec. 19, 2006

(54) OPTICAL DEVICE MOUNTED SUBSTRATE ASSEMBLY

(75) Inventors: Takeshi Oono, Aichi (JP); Toshikatsu Takada, Aichi (JP); Mitsugu Onoda, Nagoya (JP); Toshifumi Kojima, Aichi (JP); Toshikazu Horio, Aichi (JP); Ayako Kawamura, Nagoya (JP)

(73) Assignee: Nor Spark Plug Co., Ltd., Aichi (JP)

( * ) Notice: Subject to any disclaimer, the term of this patent is extended or adjusted under 35 U.S.C. 154(b) by 41 days.

(21) Appl. No.: 10/782,870

(22) Filed: Feb. 23, 2004

(65) Prior Publication Data

US 2005/0105860 A1    May 19, 2005

(30) Foreign Application Priority Data

| Feb. 24, 2003 | (JP) | ............................. 2003-045469 |
| Jun. 27, 2003 | (JP) | ............................. 2003-185881 |
| Sep. 5, 2003 | (JP) | ............................. 2003-313626 |
| Nov. 13, 2003 | (JP) | ............................. 2003-383391 |

(51) Int. Cl.
  G02B 6/36   (2006.01)
  H01L 21/00   (2006.01)
  C03B 29/00   (2006.01)
(52) U.S. Cl. ............................. 385/88; 385/14; 385/15; 385/52; 385/92; 438/29; 156/89.11
(58) Field of Classification Search ................... 385/14, 385/88, 92, 15, 52; 156/89.11; 438/29
See application file for complete search history.

(56) References Cited

U.S. PATENT DOCUMENTS 5,631,988 A * 5/1997 Swirhun et al. ............... 385/89
5,987,202 A * 11/1999 Gruenwald et al. ........... 385/49
6,641,310 B1 * 11/2003 Williams ...................... 385/92
2003/0053766 A1 * 3/2003 Cheng et al. .................. 385/89
2003/0068153 A1   4/2003 Suzuki

FOREIGN PATENT DOCUMENTS

| JP | 8-250542 |   | 9/1996 |
| JP | 08-250542 | * | 9/1996 |
| JP | 2002-236228 | * | 8/2002 |
| JP | 2003-107283 |   | 4/2003 |

OTHER PUBLICATIONS

T. Ohta et al.; "Two Dimensional Array MT Connector"; Fujikura Technical Review; No. 97; Oct. 1999; pp. 22-27.

* cited by examiner

*Primary Examiner*—Brian Healy
*Assistant Examiner*—Michael P. Mooney
(74) *Attorney, Agent, or Firm*—Sughrue Mion, PLLC

(57) ABSTRACT

An optical device mounted substrate assembly includes a ceramic substrate having a first recess, an optical device mounted on the ceramic substrate and having one of a light emitting portion and a light receiving portion, the optical device being to be optically connected to one of an optical waveguide and an optical fiber connector in way as to align optical axes of the optical wave guide or the optical fiber connector with each other, a resin layer disposed in the first recess and having a second recess smaller in diameter than the first recess, and an alignment guide member fitted in the second recess and having a protruded portion protruding from a front surface of the ceramic substrate and fittingly engageable in an alignment hole of one of the optical waveguide and the optical fiber connector. A fabrication method of such a substrate assembly is also provided.

13 Claims, 16 Drawing Sheets

OPTICAL DEVICE MOUNTED SUBSTRATE ASSEMBLY

BACKGROUND OF THE INVENTION

The present invention relates to an improvement in or relating to an optical device mounted substrate assembly. More specifically, the present invention relates to an optical device mounted substrate assembly (i.e., an assembly of a substrate and an optical device) and a fabrication method thereof, an optical waveguide equipped optical device mounted substrate assembly (i.e., an assembly of a substrate and an optical device equipped with an optical waveguide) and a fabrication method thereof, an optical fiber connector equipped optical device mounted substrate assembly (i.e., an assembly of a substrate and an optical device equipped with an optical fiber connector and a fabrication method thereof, and an optical component equipped optical device mounted substrate assembly (i.e. an assembly of a substrate and an optical device equipped with an optical component).

In recent years, with the development of information communication techniques represented by the Internet and a great improvement in the processing speed of information processing systems, the needs to send and receive high volume data such as images are increasing. In order to send and receive such high volume data freely through information communication facilities, an information transmission speed of 10 Gbps or larger is desirable. Optical communication techniques are greatly expected as the techniques to realize a high-speed telecommunication environment. In the meantime, it is desired to transmit signals at high speed through relatively short signal transmission paths such as connecting paths between circuit boards in systems, connecting paths between semiconductor chips of circuit boards and connecting paths in semiconductor chips. To this end, it is considered ideal to shift from transmission using metal cables and wirings, which has generally been used, to optical transmission using optical fibers and waveguides.

Circuit boards mounting thereon optical devices and adapted to make optical communication between the optical device and an optical fiber or optical waveguide have been proposed as disclosed in Unexamined Japanese Patent Publications Nos. 2002-236228 and 8-250542. Disclosed in the Unexamined Japanese Patent publications is such a technique that an external substrate mounting thereon an optical device can be positioned in place on a circuit board by a self-alignment effect attained at the time solder bumps for connection between the external substrate and the circuit board are reflowed. Furthermore, as a unit to connect optical fibers each other, a device called an optical fiber connector has been proposed as disclosed in Fujikura Technical Review No. 97, October, 1999.

SUMMARY OF THE INVENTION

However, in the techniques described in the above-described Unexamined Japanese Patent Publications, alignment or positioning (optical axis alignment) of the external substrate mounting thereon the optical device with respect to the circuit board is merely attained by solder reflow processing. For this reason, alignment accuracy is insufficient, and a shift or movement of the optical axes of the optical device relative to the optical axes of the optical waveguide tends to be caused, thus likely causing an optical transmission loss. Therefore, such techniques are considered incapable of sufficiently meeting a demand for realization of high speed and high density optical communicated expected in future. Moreover, in the case where the circuit board is a resin substrate, heat radiation or dissipation of the optical device and an operation circuit thereof is deteriorated. Consequently, a drift is likely to be generated in the emission wavelength. Therefore, stable operating characteristics cannot be obtained in this case.

In addition, in case the circuit board is a ceramic circuit board, the problem of heat dissipation is solved to some extent, but there is possibly caused an increase in cost since the ceramic circuit board is poor in the machinability or workability.

Further, it can be considered to use the optical fiber connector described in the Fujikura Technical Review No. 97 for connecting the circuit board to the optical fibers, but the optical fiber connector is poor in radiation or removal of heat because it is a resin product. Therefore, heat cannot be removed efficiently from the optical device and the active circuits, so that a drift is likely to be generated in the emission wavelength as well.

It is accordingly an object of the present invention to provide an optical device mounted substrate assembly and a fabrication method thereof, an optical waveguide equipped optical device mounted substrate assembly and a fabrication method thereof, an optical fiber connector equipped optical device mounted substrate assembly and a fabrication method thereof, and an optical component equipped optical device mounted substrate assembly, which can attain accurate and assured positioning that enables optical axes to be aligned accurately and assuredly and whose optical transmission loss is small.

According to an aspect of the present invention there is provided an optical device mounted substrate assembly comprising a ceramic substrate having a front surface and a first recess having an open end at least at the front surface, an optical device mounted on the front surface of the ceramic substrate and having at least one of a light emitting portion and a light receiving portion, the optical device being to be optically connected to an optical waveguide or an optical fiber connector in a way as to align optical axes of the optical device and the optical wave guide or the optical fiber connector with each other, a resin layer disposed in the first recess and having a second recess smaller in diameter than the first recess and having an open end at least at the front surface, and an alignment guide member fitted in the second recess and having a protruded portion protruding from the front surface of the ceramic substrate and fittingly engageable in an alignment hole of the optical waveguide or the optical fiber connector. In the meantime. "the optical waveguide" and "the optical fiber connector" are members separately formed from the optical device mounted substrate assembly, so that they are the objects to be aligned with the optical device mounted substrate assembly and are not essential elements of the present invention.

According to another aspect of the present invention, there is provided an optical waveguide equipped optical device mounted substrate assembly comprising an optical waveguide, a ceramic substrate having a front surface and a first recess having an open end at least at the front surface, an optical device mounted on the front surface of the ceramic substrate and having at least one of a light emitting portion and a light receiving portion, the optical device being optically connected to the optical waveguide in a way as to align optical axes of the optical device and optical waveguide with each other, a resin layer placed in the first recess and having a second recess smaller in diameter than the first recess and opened at least in the front surface, and an alignment guide member fitted in the second recess and having a protruded portion protruding from the front surface of the ceramic substrate and fittingly engageable in an alignment hole of the optical waveguide.

According to a further aspect of the present invention there is provided an optical fiber connector equipped optical device mounted substrate assembly comprising an optical fiber connector, a ceramic substrate having a front surface and a first recess having an open end at least at the front surface, an optical device mounted on the front surface of the ceramic substrate and having at least one of a light emitting portion and a light receiving portion, the optical device being optically connected to the optical fiber connector in a way as to align optical axes of the optical device and the optical fiber connector with each other, a resin layer placed in the first recess, and having a second recess smaller in diameter than the first recess and opened at least in front surface, and an alignment guide member fitted in the second recess and a protruded portion protruding from the front surface of the ceramic substrate and fittingly engageable in an alignment hole of the optical fiber connector.

Therefore, according to these inventions, the alignment guide member protruding from the ceramic substrate is fitted in the alignment hole of the optical waveguide or the optical fiber connector, which enables the optical axes of the optical device and the optical waveguide or the optical fiber connector to be aligned with each other accurately and assuredly. Therefore, an optical device mounted substrate assembly is small in optical transmission loss and sufficiently ready for high speed and high density. Furthermore, since the ceramic substrate with thermal conductivity higher than that of the resin substrate is used, the heat of the optical device and the active circuits is dissipated efficiently. Thus, an optical device mounted substrate assembly excellent in stable operations and reliability can be realized in which a drift in the emission wavelength caused by a deterioration of heat dissipation is also avoided.

As the ceramic substrate configuring the optical device mounted substrate assembly, substrates made of materials with physical and mechanical properties suitable for circuit boards (for example, materials with insulation and thermal conductivity) are preferable. Preferable examples are substrates made of alumina, aluminium nitride, silicon nitride, boron nitride, beryllia, mullite, low-temperature fired glass ceramics, and glass ceramics. Among all of them, it is particularly preferable to select substrates made of alumina or aluminium nitride.

Preferably, these ceramic substrates are the ceramic circuit boards having an insulating layer and a conductor layer (metal interconnect layer). It is acceptable that the conductor layer is formed on the substrate surface, or inside the substrate. In order to provide interlayer connection between the conductor layers, it will do to form via hole conductors inside the substrate. In addition, for example, the conductor layers and the via hole conductors are formed by printing or filling a conductive metal paste made of gold (Au), silver (Ag), copper (Cu), platinum (Pt), tungsten (W), and molybdenum (Mo). Then, electrical signals are carried through these conductor layers. Moreover, in addition to the ceramic circuit boards, for example, it is acceptable to use a build-up circuit board in which a build-up layer formed by alternately laminating insulating layers and conductor layers is provided on a ceramic substrate.

The ceramic substrate has the front surface, and the first recess opened at least in the front surface. Therefore, it will do that the first recess is a non-through hole opened only in the front surface (that is, a single opening is provided), and a through hole also opened in the surface on the opposite side of the front surface (that is, two openings are provided). The size and shape of the first recess are not defined particularly, as long as the resin layer, which will be described later, can be formed and the alignment guide member can be supported.

One or more optical devices are mounted on the front surface of the ceramic substrate. As the mounting methods, for example, techniques such as wire bonding and flip chip bonding and techniques with anisotropic conductive materials can be adopted. As optical devices having the light emitting portion (that is, light emitting devices), for example, a Light Emitting Diode (LED), a semiconductor Laser Diodes (LD), and a Vertical Cavity Surface Emitting Laser (VCSEL) can be named. These light emitting devices have a function that converts inputted electrical signals to optical signals and then emits the optical signals from the light emitting portion toward a predetermined area of the optical waveguide or the optical fiber connector. In the meantime, as optical devices having the light receiving portion (that is, light receiving devices), for example, a pin Photo Diode (pin PD), and an avalanche photodiode (APD) can be named. These light receiving devices have a function that receives optical signals having been emitted from a predetermined area of the optical waveguide or the optical fiber connector in the light receiving portion and converts the entered optical signals to electrical signals for output. Therefore, the light emitting portion of the light emitting device and the light receiving portion of the light receiving device are optically connected to the optical waveguide or the optical fiber connector in the state that the optical axes are aligned with each other. In addition, it is acceptable that the optical device has both of the light emitting portion and the light receiving portion. As materials suitable for use in the optical device, for example, Si, Ge, InGaAs, GaAsP, and GaAlAs can be named. These optical devices (particularly the light emitting devices) are operated by active circuits. For example, the optical device and the active circuits are electrically connected to each other through the conductor layers (metal interconnect layers) formed in the ceramic substrate.

The optical waveguide is a plate-like or film-like member having a core to be an optical path through which optical signals propagate and a cladding surrounding the core. For example, there are organic optical waveguides made of polymer materials, and inorganic optical waveguides made of silica glass and compound semiconductors. As the polymer material, photosensitive resins, thermosetting resins, and thermoplastic resins can be selected. More specifically, polyimide resins such as fluoridated polyimide, epoxy resins, UV cure epoxy resins, acryl resins such as PMMA (polymethyl methacrylate), deuterated PMMA and deuterated and fluorinated PMMA, and polyolefin resins are preferable.

The optical fiber connector is intrinsically a unit to connect optical fibers each other, but it is used as a unit to connect the optical fiber to the substrate here. In addition, it is acceptable that this optical fiber connector is a single-core optical fiber connector or multicore optical fiber connector. Moreover, in addition to its intrinsic function to intend to connect to the substrate, for example, the optical fiber connector may have an additional function that reflects light and switches optical paths.

The resin layer is placed in the first recess, more specifically, on the inner side surface of the first recess. The resin layer has the second recess smaller in diameter than the first recess and opened at least in the front surface. Thus, the second recess may be a non-through hole opened only in the front surface (that is, a single opening is provided), and a through hole also opened in the surface on the opposite side of the front surface (that is, two openings are provided). The size and shape of the second recess are not defined particularly, as long as the alignment guide member, which will be described later, can be supported. Furthermore, the center line of the first recess is not necessarily aligned with the center line of the second recess.

Here, the second recess is preferably a high-precision processed or machined hole. This is because the alignment guide member to be the reference in the optical axis alignment can be supported at a right position when it is the high-precision processed or machined hole.

Resins for forming the resin layer are not defined particularly. For example, thermosetting resins, thermoplastic resins, and photosensitive resins can be used. More specific examples of the thermosetting resins are epoxy resins, polyimide resins, fluororesins, bismaleimide resins, polyphenylene resins, phenol resins, and polyolefin resins. In this case, thermosetting resins with small cure shrinkage are preferably selected. More specific examples of the thermoplastic resins are polysulfone (PSF), polyphenylether (PPE), poly (phenylene sulfone) (PPS), poly (ethersulfone) (PES), and polyphenylene sulfide (PPES).

The resin layer may contain fillers other than resins. As these fillers, organic fillers made of resins, and inorganic fillers made of ceramics, metals, and glass can be named. In this case, in view of easy processing, the organic fillers are relatively advantageous for selection. In view of thermal expansion coefficient matching with the ceramic substrate, the inorganic fillers are relatively advantageous for selection. More specifically, in the case of the resin layer containing the inorganic filler, the thermal expansion coefficient is matched with that of the ceramic substrate. Consequently, it is hard to generate cracks in the interface to the ceramic substrate (that is, the interface to the inner wall surface of the first recess) to improve the reliability in that place. Therefore, the strength of the alignment guide member for support is improved. Furthermore, it is hard to reduce the alignment accuracy of the alignment guide member even when the resin layer supports the alignment guide member.

Moreover, the resin layer preferably contains the inorganic filler with thermal conductivity higher than that of the resin configuring the resin layer. In this case, this is because the thermal conductivity of the resin layer is improved and then the total heat dissipation of the optical device mounted substrate assembly is improved. Besides, this is because heat can be released to the ceramic substrate side through the resin layer even though heat is generated in the resin layer in processing the second recess.

As ceramic materials suitable for the inorganic filler, for example, alumina, aluminium nitride, boron nitride, silica, silicon nitride, silicon carbide, magnesia, beryllia, and titania can be named. Furthermore, as metal materials suitable for the inorganic filler, for example, gold (Au), silver (Ag), copper (Cu), platinum (Pt), tungsten (W), and molybdenum (Mo) can be named.

The alignment guide member is supported on the resin layer (ceramic substrate) by being fitted in the second recess. In this supported state, a part of the alignment guide member is extended from the front surface of the ceramic substrate. Here, the shape of the alignment guide member is not defined particularly, but a pin-shaped product (guide pin) is preferable, for example. Metals that are hard to some extent are preferable for the material. Moreover, the diameter of the alignment guide member (particularly, the diameter of the portion extended from the front surface of the ceramic substrate) needs to be the same diameter as that of the alignment hole so as to fit in the alignment hole of the optical waveguide or the optical fiber connector.

The number of the alignment guide member is not defined particularly, but multiple alignment guide members are more preferable than a single alignment guide member in view of the improvement of alignment accuracy and fixing strength. When the alignment guide member is in multiple numbers, they are preferably disposed closer to the optical device, particularly disposed on both sides of the optical device as they sandwich the light emitting portion or light receiving portion.

According to a further aspect of the present invention, there is provided a fabrication method of an optical device mounted substrate assembly including a ceramic substrate having a front surface and a first recess opened at least in the front surface, an optical device mounted on the front surface of the ceramic substrate, having at least one of a light emitting portion and a light receiving portion, and optically connected to an optical waveguide or an optical fiber connector in a state that optical axes thereof are aligned with each other, a resin layer placed in the first recess, and having a second recess smaller in diameter than the first recess and opened at least in the front surface, and an alignment guide member fitted in the second recess and having a protruded portion protruding from the front surface of the ceramic substrate and fittingly engageable in an alignment hole of the optical waveguide or the optical fiber connector, the method comprising a first perforating step of forming the first recess in an unsintered ceramic product by machining, a firing step of firing the unsintered ceramic product to form the ceramic substrate, a resin layer forming step of forming the resin layer in the first recess, a second perforating step of forming the second recess in the resin layer by machining after the resin layer forming step, and a guide member fitting step of fitting the alignment guide member in the second recess. In the meantime, members of "the optical waveguide" and "the optical fiber connector" in the optical device mounted substrate assembly are the members separately formed from the optical device mounted substrate assembly and are objects to be aligned with the optical device mounted substrate assembly, so that both are not essential components.

Therefore, according to the invention, the optical device mounted substrate assembly can be fabricated reliably at low cost.

According to a further aspect of the present invention, there is provided a fabrication method of an optical waveguide equipped optical device mounted substrate assembly including a ceramic substrate having an optical waveguide, a front surface, and a first recess opened at least in the front surface, an optical device mounted on the front surface of the ceramic substrate, having at least one of a light emitting portion and a light receiving portion, and optically connected to the optical waveguide in a state that optical axes thereof are aligned with each other; a resin layer placed in the first recess, and having a second recess smaller in diameter than the first recess and opened at least in the front surface, and an alignment guide member fitted in the second recess and having a protruded portion protruding from the front surface of the ceramic substrate and fittingly engageable in an alignment hole of the optical waveguide, the method comprising an alignment hole forming step of forming the alignment hole in the optical waveguide, a first perforating step of forming the first, recess in an unsintered ceramic product, a firing step of firing the unsintered ceramic product to form the ceramic substrate, a resin layer forming step of forming the resin layer in the first recess, a second perforating step of forming the second recess in the resin layer by machining after the resin layer forming step, a guide member fitting step of fitting the alignment guide member in the second recess, and an alignment step of aligning the optical axes of the optical waveguide and the optical device each other by fitting the alignment guide member in the alignment hole.

According to a further aspect of the present invention, there is provided a fabrication method of an optical fiber connector equipped optical device mounted substrate assembly including a ceramic substrate having an optical fiber connector, a front surface, and a first recess opened at least in the front surface; an optical device mounted on the front surface of the ceramic substrate, having at least one of a light emitting portion and a light receiving portion, and optically connected to the optical fiber connector in a state that optical axes are aligned with each other, a resin layer placed in the first recess, and having a second recess smaller in diameter than the first recess and opened at least in the front surface, and an alignment guide member fitted in the second recess and having a protruded portion protruding from the front surface of the ceramic substrate and fittingly engageable in an alignment hole of the optical fiber connector, the method comprising an alignment hole forming step of forming the alignment hole in the optical fiber connector, a first perforating step of forming the first recess in an unsintered ceramic product by machining, a firing step of firing the unsintered ceramic product to form the ceramic substrate, a resin layer forming step of forming the resin layer in the first recess, a second perforating step of forming the second recess in the resin layer by machining after the resin layer forming step, a guide member fitting step of fitting the alignment guide member in the second recess, and an alignment step of aligning the optical axes of the optical fiber connector and the optical device each other by fitting the alignment guide member into the alignment hole.

Hereinafter, the fabrication method of the optical device mounted substrate assembly will be described along the process steps.

In the alignment hole forming step, the alignment hole is formed in the optical waveguide or the optical fiber connector. Here, known perforating techniques can be used in the alignment hole forming step. Specific examples are drilling, punching, etching, and laser beam machining. However, in view of low costs, mechanical machining such as drilling and punching are preferable. Furthermore, more preferably, drilling or machining conducted here is precision drilling with a precision drill. This is because the optical axis alignment can be conducted highly accurately when the alignment hole is formed by these methods. Moreover, the alignment hole may be a through hole opened through the front and back sides of the optical waveguide or the optical fiber connector and a non-through hole opened only in the back side. Besides, it will do to make fine adjustment of the diameter of the alignment hole by finish machining after the alignment hole forming step.

In the first perforating step, the first recess is formed in the unsintered ceramic product by machining such as drilling. The reason to form a hole in the unsintered ceramic material is as follows. That is, since the ceramic material has a property to harden when fully fired, machining becomes difficult and machining costs are increased. On the other hand, forming a hole in the unsintered ceramic material not so hard can be conducted relatively easily at low costs. Here, well-known techniques can be adopted as the perforating methods in the first perforating step. More specific examples are drilling, punching, and laser beam machining. However, in view of low costs, mechanical machining such as drilling and punching are preferable, more preferably, punching.

In the first perforating step, perforating is preferably performed so that the inner diameter of the first recess after the firing step is greater than the inner diameter of the second recess and the diameter of the alignment guide member for forming the first recess. This is because the first recess needs to be greater in consideration of shrinkage of the ceramic material after the firing step which causes the first recess to become smaller in diameter and move out of position.

In the subsequent firing step, the unsintered ceramic product is heated at high temperature to form the ceramic substrate. At this point of time, the ceramic is hardened. The firing temperature and firing time are properly set in accordance with the type of selected ceramic.

In the subsequent resin layer forming step, the resin layer is formed in the first recess. Techniques of forming the resin layer in the first recess are not defined particularly. For example, a method is preferable that fills an uncured resin material in the first recess and then cures the resin material. According to the method, a space between the first recess and the resin layer is eliminated, and the adhesion of the resin layer to the inner wall surface of the first recess is improved. Therefore, the resin layer can be held reliably in the first recess, and then the alignment guide member can be held reliably in the ceramic substrate.

For example, when a thermosetting resin is selected, it is heated after filled, and then the resin material is cured. When a photosensitive resin is selected, ultraviolet rays are irradiated thereto, and then the resin material is cured. For example, the resin material can be filled by techniques such as printing. Furthermore, it is acceptable to use uncured resin materials containing a variety of fillers as the resin material, and to use uncured resin materials containing inorganic fillers with thermal conductivity higher than that of the resin configuring the resin layer. The reasons are described above. Moreover, it will do to adopt techniques of filling no uncured resin materials, for example, a technique of fitting a resin product completely or partially cured into the first recess.

Here, it is acceptable to conduct a polishing step of polishing at least the front surface of the ceramic substrate to remove an excessive resin layer projected from the opening of the first recess or the resin layer attached to the ceramic substrate surface. When this step is conducted, dips and bumps on the front surface of the ceramic substrate are removed and planarized. Thus, the optical device can be mounted in parallel to the front surface of the ceramic substrate in the later step. This is preferable to enhance the accuracy of optical axis alignment. That is, this is because the optical axes are hard to align each other when the optical device is inclined, not in parallel to the front surface of the ceramic substrate.

In the subsequent second perforating step, the second recess is formed in the resin layer by drilling or other machining after the resin layer forming step. Well-known technique can be used as a perforating or machining method in the second perforating step, but precision drilling is desirable in this case. This is because the alignment guide member to be the reference in the optical axis alignment can be held at the desired, right position when the second recess is formed by this method. More specific techniques of precision machining are drilling, punching, and laser beam machining, but drilling with a precision drill is most preferable in consideration of cost. In addition, it will do to conduct the polishing step after the second perforating step. In this case, burrs generated in the second perforating step can be removed reliably.

Furthermore, it will do to make fine adjustment of the diameter by finish machining after the second perforating step as required. Moreover, it will do to conduct the second perforating step as the resin layer is partially cured and then the resin layer is fully cured for finish machining.

Besides, instead of the technique of conducting the second perforating step after the resin layer forming step, it will do to adopt a technique of conducting the resin layer forming step and the second perforating step at the same time, for example. More specifically, a spacer member is first disposed in the first recess. A preferred example of the spacer member is a mold with a pin, for example. The pin has a shape corresponding to the shape of the alignment guide member. In this case, the mold and the substrate have to be aligned with each other highly accurately. In this state, an uncured resin material is filled and cured, and then the spacer member is removed. According to the technique, the resin layer having the second recess can be formed extremely at low costs.

Then, after the alignment guide member is fitted in the second recess in the guide member fitting step, the alignment guide member is fitted in the alignment hole. That is, when the optical axes of the optical waveguide and the optical device are aligned with each other by the alignment step, a desired optical waveguide equipped optical device mounted substrate assembly can be obtained. Furthermore, when the optical axes of the optical fiber connector and the optical device are aligned with each other by the alignment step, a desired optical fiber connector equipped optical device mounted substrate assembly can be obtained.

Moreover, instead of the technique of sequentially conducting the resin layer forming step, the second perforating step, and the guide member fitting step, it is acceptable to adopt a technique of conducting the resin layer forming step and the guide member mounting step at the same time as below, for example. More specifically, the alignment guide member is first held in a state that a part thereof. Is inserted into the first recess. In this case, desirably, the alignment guide member is aligned highly accurately. In addition, more preferably, a plurality of the alignment guide members is temporarily held and fixed with a guide member holding jig. Subsequently, in this state, an uncured resin material is filled and cured in the first recess. Consequently, the resin layer having the second recess is formed, and at the same time, the alignment guide member can be supported on the second recess. The guide member holding jig is removed after the resin is cured. This technique is also advantageous for realizing low costs.

According to a further aspect of the present invention, there is provided an optical component equipped optical device mounted substrate assembly comprising an optical component having at least one of an optical transmission function, a light condensing function, and a light reflecting function, and having an optical component side alignment recess, a substrate having a substrate side alignment recess, an optical device mounted on the substrate, having at least one of a light emitting portion and a light receiving portion, and optically connected to the optical component in a state that optical axes thereof are aligned with each other, and an alignment guide member fitted in the optical component side alignment recess and the substrate side alignment recess.

According to a further aspect of the present invention, there is provided an optical device mounted substrate assembly comprising a substrate having a substrate, side alignment recess, an optical device mounted on the substrate, having at least one of a light emitting portion and a light receiving portion, and optically connected to an optical component having at least one of an optical transmission function, a light condensing function, and a light reflecting function in a state that optical axes thereof are aligned with each other, and an alignment guide member fitted in the substrate side alignment recess and fittingly engageable in the optical component side alignment recess of the optical component.

Therefore, according to these inventions, the alignment guide member is fitted in both of the optical component side alignment recess and the substrate side alignment recess, and then the optical axes of the optical component and the optical device are aligned with each other more positively and highly accurately. Accordingly, an optical device mounted substrate assembly is small in optical transmission loss and sufficiently ready for high speed and high density optical communication.

The optical component is a component that has at least one of the optical transmission function, the light condensing function, and the light reflecting function. More specific examples of the optical component having the optical transmission function are optical waveguides and optical fibers. In addition, the base material supporting the optical waveguide also falls into the optical component having the optical transmission function. The optical component formed of the optical fiber and the optical fiber connector supporting the optical fiber also falls into the optical component having the optical transmission function. For example, the optical component having the light condensing function is lens components typified by a microlens array. For example, the optical component having the light reflecting function is an optical path switching component. Furthermore, the optical fiber connector formed with an optical path switching part can be said that it is the optical component having the light reflecting function. The optical waveguide formed with the optical path switching part can be said that it is the optical component having the optical transmission function and the light reflecting function.

The optical component side alignment recess and the substrate side alignment recess can be a non-through hole having an open end only at one surface thereof (i.e., only one open end is provided) or a through hole having open ends at both opposite surfaces (i.e., two open ends are provided). However, when three or more of components are layered and fixed, the component in the inner layer desirably has a through alignment recess.

When the optical component is a lens component, it is acceptable that the optical component side alignment recess is directly formed in the lens component. More preferably, the recess is indirectly formed through a separate product. More specifically, it will do that the lens component is supported on a lens support body formed of the separate product and the optical component side alignment recess is formed in the lens support body. This structure is effective for attaining low cost. Furthermore, the lens support body can be formed of resins and metals, for example. Preferably, resins are selected in view of easy precision processing or machining.

Substrates made of metals, resins or ceramics can be used as the substrate, but the substrates made of ceramics are more preferable. As preferred examples of the ceramic substrate, substrates made of alumina, aluminium nitride, silicon nitride, boron nitride, beryllia, mullite, low-temperature fired glass ceramics, and glass ceramics can be named. Among all of them, the substrates made of alumina or aluminium nitride are more preferable.

DESCRIPTION OF THE PREFERRED EMBODIMENTS

[First Embodiment]

Hereinafter, an optical waveguide equipped optical device mounted substrate assembly (substrate assembly for supporting an optical component equipped with another optical component) 10 according to a first embodiment of the present invention will be described in detail with reference to FIG. 1 to 13.

Figure 1:
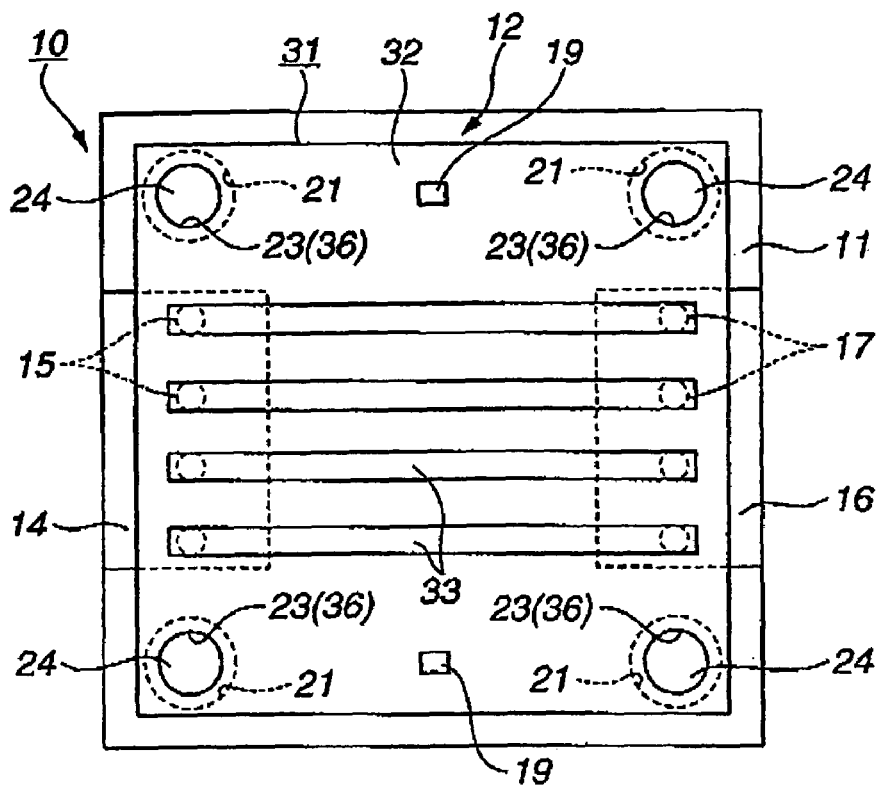
FIG. 1 is a schematic plan view of an optical waveguide equipped optical device mounted substrate assembly according to a first embodiment of the present invention.
Figure 2:
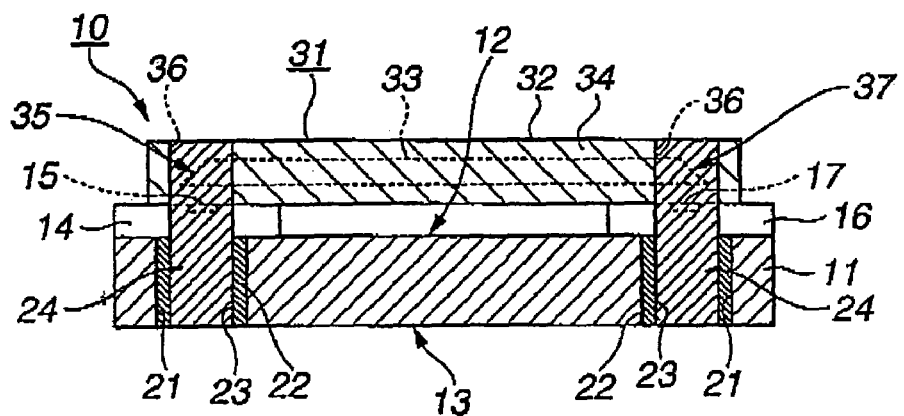
FIG. 2 is a schematic cross-sectional view of the optical device mounted substrate assembly.
Figure 3:
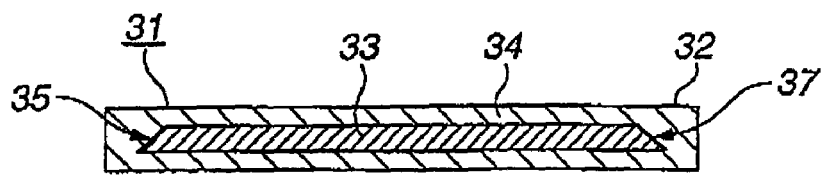
FIG. 3 is a schematic cross-sectional view of an optical waveguide in the fabrication process of the optical device mounted substrate assembly.

As shown in FIGS. 1 and 2, a ceramic substrate 11 configuring the optical device mounted substrate assembly 10 of the embodiment is a nearly rectangular plate member having a top surface 12 (front surface) and an under surface 13. This ceramic substrate 11 is a so-called multilayer circuit board having the top surface 12 (front surface), the under surface 13, and metal interconnect layers, not shown. The ceramic substrate 11 also has via hole conductors (omitted in the drawing), and the metal interconnect layers in different layers are in interlayer connection through the via hole conductors.

In FIG. 2, a VCSEL 14 (optical device), which is one kind of optical device (light emitting device), is mounted on the left end of the top surface 12 of the ceramic substrate 11 as the emission surface is faced upward. The VCSEL 14 has a plurality (here, four) of light emitting portions 15 arranged in a row in the emission surface. Thus, the light emitting portions 15 emit a predetermined wavelength of laser beams in the direction orthogonal to the top surface 12 of the ceramic substrate 11 (that is, toward the top of FIG. 2). On the other hand in FIG. 2, a photodiode 16, which is one kind of optical device (light receiving device), is mounted on the right end of the top surface 12 of the ceramic substrate 11 as the light receiving surface is faced upward. The photodiode 16 has a plurality (here, four) of light receiving portions 17 arranged in a row in the light receiving surface. Therefore, the light receiving portions 17 are configured to easily receive laser beams traveling from the top to the bottom of FIG. 2.

Moreover, the photodiode 16 and the VCSEL 14 are joined to a metal interconnect layer on the top surface 12 of the ceramic substrate 11. Particularly, the VCSEL 14 is electrically connected to an active circuit IC mounted on the top surface 12 of the ceramic substrate 11, not shown, through the metal interconnect layer.

As shown in FIGS. 1 and 2, first through holes 21 are disposed as first recesses at a plurality of places (four places here) in the ceramic substrate 11. The first through holes 21 are circular in the same cross sections, and opened in the top surface 12 (front surface) and the under surface 13 of the ceramic substrate 11. In the embodiment, the diameter of the first through hole 21 is formed to be about 1.0 to 2.0 mm. Furthermore, in the embodiment, two of the four first through holes 21 are disposed close to the VCSEL 14, and the rest are disposed close to the photodiode 16. A pair of the first through holes 21 disposed close to the VCSEL 14 is disposed at positions sandwiching the row of the light emitting portions 15 from both ends on almost the same straight line as the row of the light emitting portions 15. A pair of the first through holes 21 disposed close to the photodiode 16 is disposed at positions sandwiching the row of the light receiving portions 17 from both ends on almost the same straight line as the row of the light receiving portions 17.

A resin layer 22 is provided inside the first through holes 21, and second through holes 23 (second recesses and substrate side alignment recesses) are disposed at almost the center part of the resin layer 22. The second through holes 23 are circular in the same cross sections, and are opened in the top surface 12 (front surface) and the under surface 13 of the ceramic substrate 11. In the embodiment, the diameter of the second through hole 23 is smaller than that of the first through holes 21 and formed to be about 0.7 mm. Inside four second through holes 23, a guide pin 24 (alignment guide member) made of stainless steel in a circular cross section is fit as one end thereof is extended from the top surface 12 (front surface). More specifically, guide pin CNF125A-21, defined by JIS C 5981 (the diameter is 0.699 mm) is used in the embodiment.

As shown in FIGS. 1 and 2, an optical waveguide 31 (optical component) in a nearly rectangular film and in a size smaller than the ceramic substrate 11 is disposed over the top surface 12 (front surface) of the ceramic substrate 11. A base material 32 configuring the optical waveguide 31 has cores 33 and a cladding 34 surrounding them from above and below. Substantially, the cores 33 are optical paths through which optical signals propagate. In the embodiment, the cores 33 and the cladding 34 are formed of transparent polymer materials with different refractive indexes, more specifically, PMMA (polymethyl methacrylate) with different refractive indexes. The cores 33 to be the optical paths are four the same as the numbers of the light emitting portions 15 and the light receiving portions 17, and are formed to extend straight in parallel with each other. An inclined plane having an angle of 45° in the longitudinal direction of the core 33 is formed on both ends of the cores 33, and a thin film made of a metal that fully reflects light is deposited on the inclined planes. Therefore, the both ends of each of the cores 33 have optical path switching mirrors 35 and 37 for reflecting light at an angle of 90°. Circular alignment holes 36 are penetrated through at four corners of the optical waveguide 31. The alignment holes 36 are formed to have a diameter of about 0.7 mm matching with the size of the guide pins 24. Then, the guide pins 24 extended from the ceramic substrate 11 are fitted in the alignment holes 36 (optical component side alignment recesses) of the optical waveguide 31. Consequently, the optical waveguide 31 is fixed on the top surface 12 (front surface) of the ceramic substrate 11 as it is aligned. Here, more specifically, 'being aligned' is a state that each of the optical path switching mirrors 35 on the left end in FIG. 2 is right above each of the light emitting portions 15 and the optical axes of each of the cores 33 and each of the light emitting portions 15 are aligned with each other and a state that each of the optical path switching mirrors 37 on the right end in FIG. 2 is right above each of the light receiving portions 17 and the optical axes of each of the cores 33 and each of the light receiving portions 17 are aligned with each other. In addition, in the embodiment, the ceramic substrate 11 and the optical waveguide 31 are fixed to each other only in the relationship between the alignment holes 36 and the guide pins 24.

The general operations of the optical waveguide equipped optical device mounted substrate assembly 10 thus configured will be described briefly.

The VCSEL 14 and the photodiode 16 are in operable states by power supply through the metal interconnect layers of the ceramic substrate 11. When electrical signals are outputted from the active circuit IC on the ceramic substrate 11 to the VCSEL 14, the VCSEL 14 converts the inputted electrical signals to optical signals (laser beams) and then emits the optical signals from the light emitting portions 15 toward the optical path switching mirrors 35 at the left ends of the cores 33. The optical signals having been emitted from the light emitting portions 15 enter from the under surface of the optical waveguide 31 to the optical path switching mirrors 35 of the cores 33. The optical signals having entered the optical path switching mirrors 35 change the traveling direction there at an angle of 90°. On this account, the optical signals propagate through the inside of the cores 33 in the longitudinal direction thereof. Then, the optical signals having reached the right end of the cores 33 enter the optical path switching mirrors 37 formed on the right end of the optical waveguide 31. The optical signals having entered the optical path switching mirrors 37 change the traveling direction there at an angle of 90°. On this account, the optical signals go out of the under surface of the optical waveguide 31, and enter the light receiving portions 17 of the photodiode 16. The photodiode 16 converts the received optical signals to electrical signals, and outputs the converted electrical signals to another IC (omitted in the drawing) on the ceramic substrate 11.

Next, a fabrication method of the optical device mounted substrate assembly 10 equipped with the optical waveguide 31 will be described based on FIGS. 3 to 13.

Figure 4:
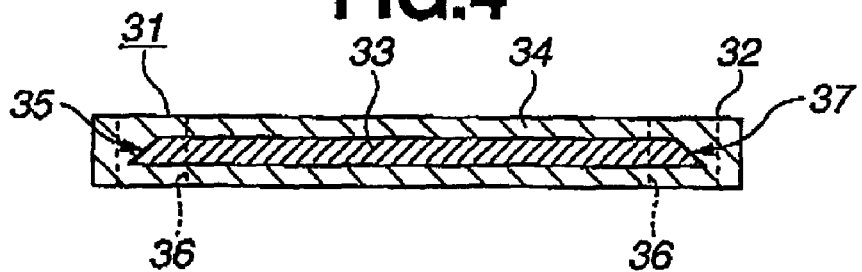
FIG. 4 is a schematic cross-sectional view illustrating a state that alignment holes are formed in the optical waveguide in the fabrication process of the optical device mounted substrate assembly.

First, the optical waveguide 31 is fabricated by previously publicly-known techniques (see FIG. 3), and it undergoes precision drilling to form the alignment holes 36 at four corners (see FIG. 4).

Figure 5:
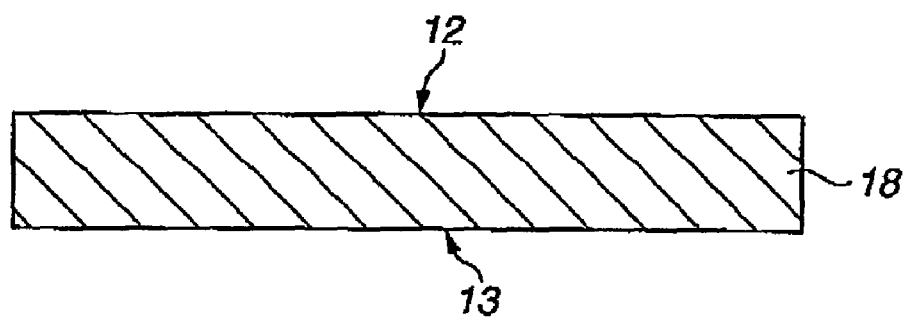
FIG. 5 is a schematic cross-sectional view of a green sheet layered product in the fabrication process of the optical device mounted substrate assembly.

Furthermore, the ceramic substrate 11 is fabricated in accordance with the following procedures. Alumina powder, an organic binder, a solvent, and a plasticizer are uniformly mixed and kneaded to form row material slurry, the row material slurry is used to shape a sheet by a doctor blade apparatus, and a green sheet in a predetermined thickness is formed. Predetermined portions of the green sheet are punched, and a metal paste for forming via hole conductors is filled in the holes formed. Moreover, a metal paste is printed on the surface of the green sheet to form a printed layer to be metal interconnect layers later. Then, a plurality of the green sheets is laminated and pressed into one piece, and a green sheet layered product 18 shown in FIG. 5 is formed. In the green sheet layered product 18 shown in FIG. 5, the metal interconnect layers and the via hole conductors are not shown for omission.

Figure 6:
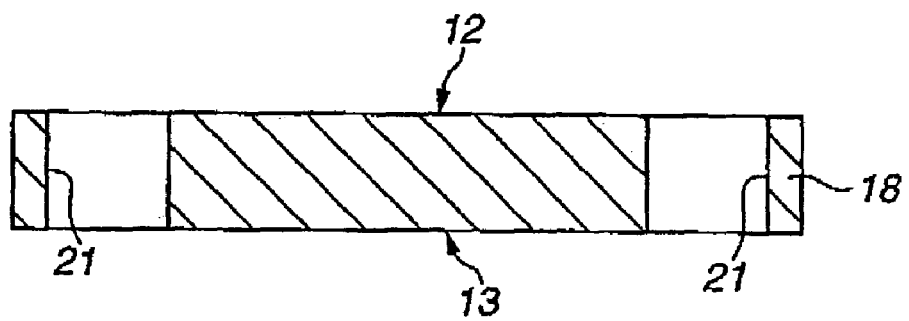
FIG. 6 is a schematic cross-sectional view illustrating a state that first through holes are formed in the green sheet layered product in the fabrication process of the optical device mounted substrate assembly.
Figure 7:
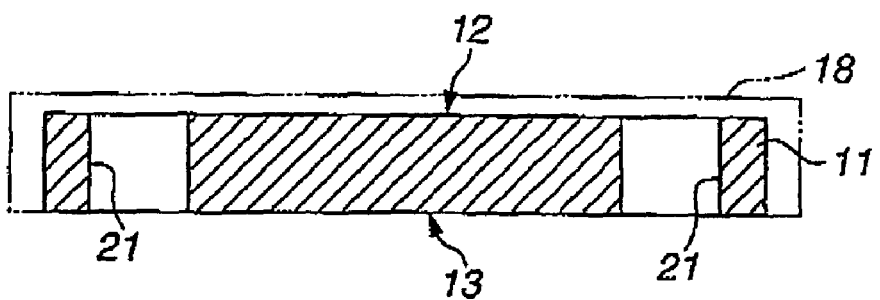
FIG. 7 is a schematic cross-sectional view illustrating a state that the green sheet layered product is fired to form a ceramic substrate in the fabrication process of the optical device mounted substrate assembly.

Subsequently, the green sheet layered product 18 is punched to form the first through holes 21 (first recesses) (a first perforating step, see FIG. 6). Since it is unsintered at this stage, holes can be bored relatively easily at low costs. In the first perforating step, perforating is performed so that the inner diameter of the first through hole 21 (first recess) after a firing step is greater than the inner diameter (about 0.7 mm) of the second through hole 23 (the second recess and the substrate side alignment recess) and the diameter (about 0.7 mm) of the guide pin 24. More specifically, the first through holes 21 are set to about 1.2 to 2.4 mm. This is because the first through holes 21 (first recesses) need to be greater in the consideration of shrinkage of the ceramic material after the firing step which causes the first through holes 21 (first recesses) to become smaller in diameter and move out of position.

Then, after a drying step and a degreasing step are conducted in accordance with well-known techniques, the firing step is conducted at temperatures that alumina can be sintered. Accordingly, the green sheet layered product 18 (unsintered ceramic product) is fired to form the ceramic substrate 11. At this point of time, the ceramic is hardened and shrunk (see FIG. 7).

In a subsequent resin layer forming step, the resin layer 22 is formed in the first through holes 21 (first recesses) as below. First, 5 parts by weight of a curing agent (2P4MZ-CN made by Shikoku Corp.), 200 parts by weight of a silica filler (TSS-6 made by Tatsumori) treated with a silane coupling agent (KBM-403 made by made by Shin-Etsu Chemical Co., Ldt.), and an anti-foaming agent (BERENOL S-4 made by SAN NOPCO LIMITED) are mixed to 80 parts by weight of bisphenol F epoxy resin (Epikote 807 made by JER Co., Ltd.), and 20 parts by weight of cresol novorac epoxy resin (Epikote 152 made by JER Co., Ltd.). The mixture is kneaded with triple rolls to form a resin material for forming the resin layer 22. That is, an uncured resin material containing an inorganic filler in a thermosetting resin is used in the embodiment.

Subsequently, the ceramic substrate 11 is set in a printing apparatus, and a predetermined metal mask (omitted in the drawing) is placed and contacted to the top surface 12. In this metal mask, openings are formed beforehand at places corresponding to the first through holes 21. The resin material is printed through the metal mask like this, and the resin material is fully filled inside each of the first through holes 21 with no space. After that, the printed ceramic substrate 11 is removed from the printing apparatus, it is heated at a temperature of 120° C. for one hour to cure the resin layer 22 formed by filling the resin material to some extent (it is partially cured) (see FIG. 8). Here, the reason why the resin layer 22 is not fully cured is that perforating in a second perforating step is can be attained more easily.

Figure 9:
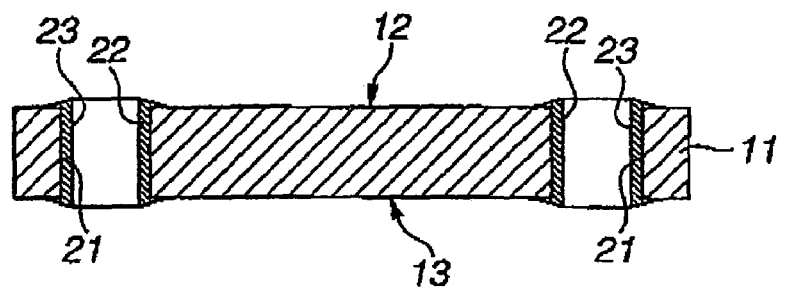
FIG. 9 is a schematic cross-sectional view illustrating a state that second through holes are formed in the resin layer in the fabrication process of the optical device mounted substrate assembly.

In the subsequent second perforating step, precision drilling with a precision drill is conducted to form the second through holes 23 (the second recesses and the substrate side alignment recesses) in the resin layer 22 (see FIG. 9). According to this machining, the second through holes 23 can be formed which can support the guide pins 24 to be the reference in the optical axis alignment at desired right positions.

Figure 10:
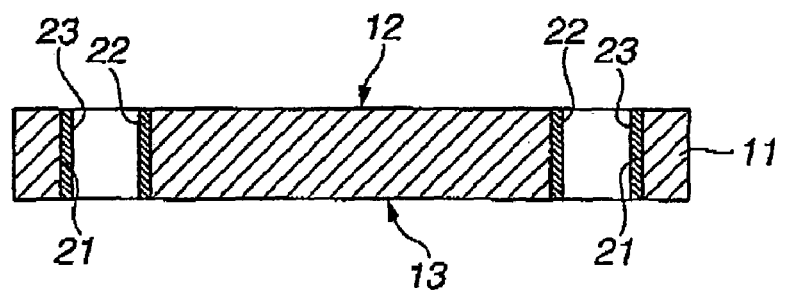
FIG. 10 is a schematic cross-sectional view illustrating a state that the surfaces of the ceramic substrate are polished in the fabrication process of the optical device mounted substrate assembly.

Then, the ceramic substrate 11 is set in a surface polishing apparatus to polish the top surface 12 and the under surface 13 to remove the excessive resin layer 22 extended from the openings of the first through holes 21 and the resin layer 22 attached to the substrate surface (see FIG. 10). In addition, this polishing step allows dips and bumps on the top surface 12 (front surface) of the ceramic substrate 11 to be eliminated and planarized.

After that, a full curing step in which the ceramic substrate 11 is heated at a temperature of 150° C. for five hours is conducted to fully cure the resin layer 22. Furthermore, known finish machining is conducted for fine adjustment of the second through holes 23, thereby adjusting the diameter of the second through hole 23 to 0.700 mm. More specifically, the accuracy required for machining at this time is ±0.001 mm.

Figure 11:
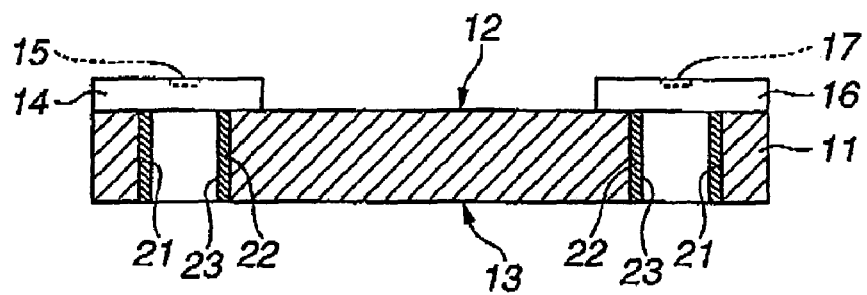
FIG. 11 is a schematic cross-sectional view illustrating a state that a VCSEL and a photodiode are mounted on the ceramic substrate in the fabrication process of the optical device mounted substrate assembly.

Subsequently, the VCSEL 14 and the photodiode 16 are mounted on the planarized top surface 12 of the ceramic substrate 11 through an anisotropic conductive material, not shown (see FIG. 11). Consequently, a part of the metal interconnect layer on the top surface 12 of the ceramic substrate 11 is electrically connected to connecting terminals of the VCSEL 14 and the photodiode 16. In addition, since the top surface 12 is a flat surface with no dips and bumps at this time, the VCSEL 14 and the photodiode 16 are in parallel to the top surface 12. In the embodiment, the optical device mounting step is conducted after finish machining and before a guide member fitting step. On this account, there is a merit that the VCSEL 14 and the photodiode 16 already mounted are not exposed to heat, vibrations, and dust, which are likely to be generated by drilling. Moreover, since the guide pins 24 are not erected yet near places where the optical devices are mounted, the VCSEL 14 and the photodiode 16 can be mounted relatively easily.

Figure 12:
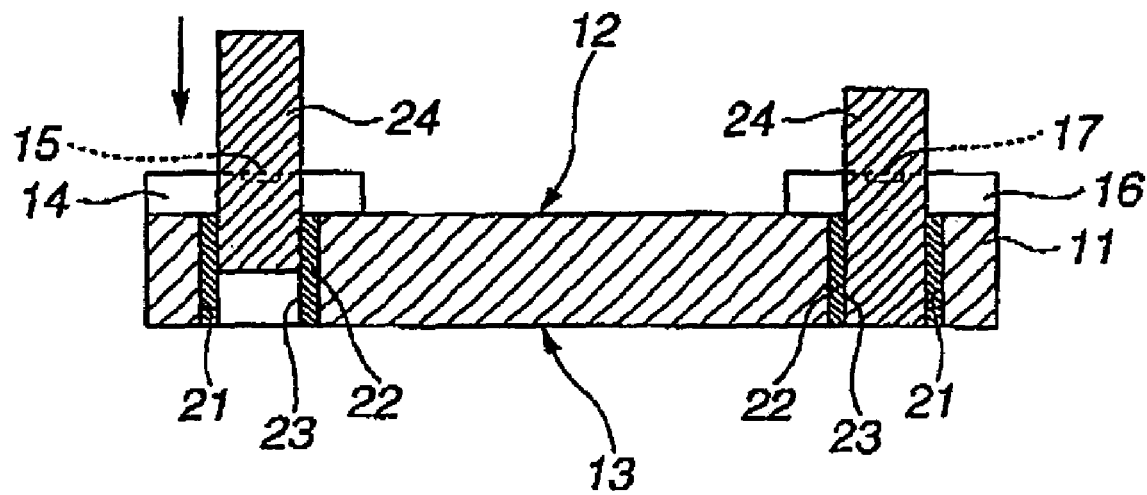
FIG. 12 is a schematic cross-sectional view illustrating a state that guide pins are fitted in the second through holes in the fabrication process of the optical device mounted substrate assembly.
Figure 13:
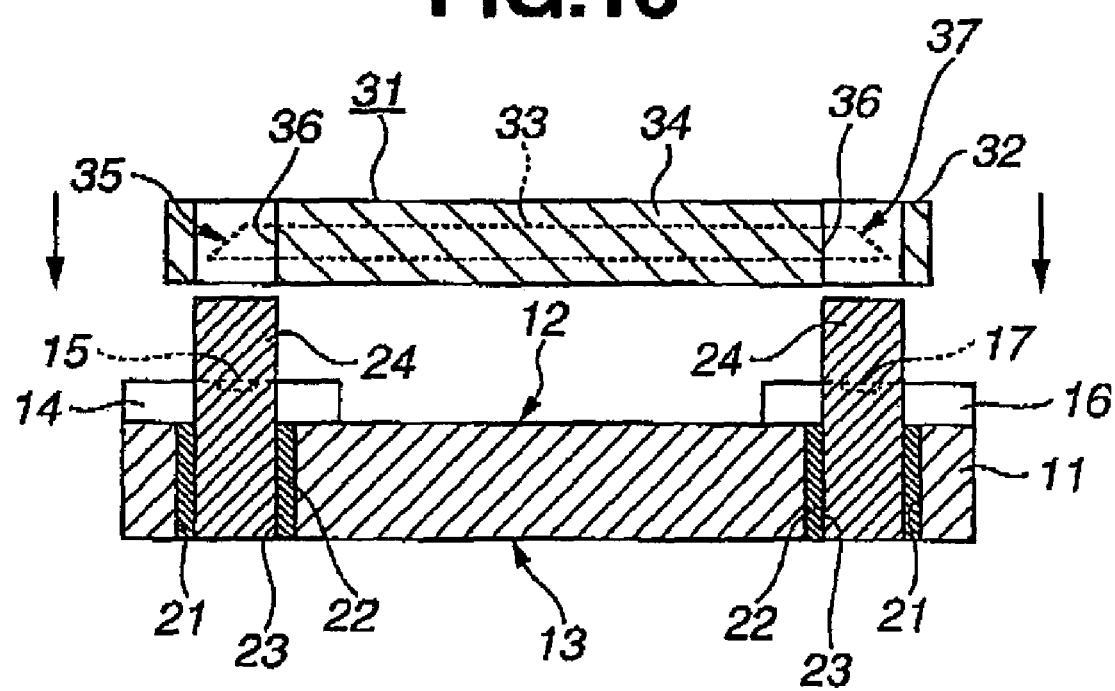
FIG. 13 is a schematic cross-sectional view illustrating a state that the optical waveguide is fixed as the ceramic substrate is aligned with the optical waveguide in the fabrication process of the optical device mounted substrate assembly.

In the subsequent guide member fitting step, the guide pins 24 are pressed and fitted in the second through holes 23 (the second recesses and the substrate side alignment recesses) with a jig for exclusive use (see FIG. 12).

In a subsequent alignment step, each of the guide pins 24 of the ceramic substrate 11 is fitted in each of the alignment holes 36 of the optical waveguide 31. Accordingly, the optical waveguide 31 is fixed to the ceramic substrate 11 as the optical axis alignment of the optical waveguide 31 with the VCSEL 14 and the optical axis alignment of the optical waveguide 31 with the photodiode 16 are conducted at the same time. As described above, the optical device with the optical waveguide mounted substrate assembly 10 of the embodiment is completed.

Therefore, the embodiment can obtain the following advantages.

(1) The embodiment is configured in which the fitting relationship between the guide pins 24 and the alignment holes 36 achieves the optical axis alignment and the ceramic substrate 11 and the optical waveguide 31 are fixed to each other. Thus, the optical axes are aligned more positively and highly accurately than the traditional passive optical axis alignment that relies only on the self-alignment effect in reflow. Therefore, the optical device mounted substrate assembly 10 is small in optical transmission loss and sufficiently ready for high speed and high density optical communication. Furthermore, since the ceramic substrate 11 with thermal conductivity higher than that of the resin substrate is used, the heat generated from the VCSEL 14 and the active circuit IC is dissipated efficiently. Accordingly, the optical device mounted substrate assembly 10 excellent in stable operations and reliability can be realized in which a drift in the emission wavelength caused by a deterioration of heat dissipation can also be avoided.

(2) According to the fabrication method of the embodiment, the optical device mounted substrate assembly 10 with the configuration described above can be fabricated reliably at low costs.

[Second Embodiment]

Next, an optical waveguide equipped optical device mounted substrate assembly (substrate assembly for supporting an optical component equipped with another optical component) 10 according to a second embodiment of the present invention will be described. The embodiment is different from the first embodiment only in that the composition of a resin layer 22 is varied from that of the first embodiment.

In the resin layer forming step, 5 parts by weight of a curing agent (2P4MZ-CN made by Shikoku Corp.), 600 parts by weight of a copper filler (SRF-Cu-10 made by Nippon Atomized Metal Powders Corporation), an antifoaming agent (BERENOL S-4 made by SAN NOPCO LIMITED), and a thickening agent (RY200 made by Nippon Aerosil Co., Ltd.) are first mixed to 100 parts by weight of an epoxy resin (Epikote 828 made by JER Co., Ltd.). The mixture is kneaded with triple rolls to form a resin material for forming the resin layer 22. That is, an uncured resin material containing an inorganic filler of high thermal conductivity in a thermosetting resin is used in the embodiment.

Then, the resin material like this is filled in the first through holes 21 by printing, it is heated and cured, and steps after the second perforating step are sequentially conducted.

Therefore, the configuration of the embodiment can exert the same advantages as those of the first embodiment. In addition to this, the resin layer 22 contains the filler made of copper having thermal conductivity higher than that of epoxy resins. On this account, the thermal conductivity of the resin layer 22 is enhanced, and the total heat dissipation of the optical device mounted substrate assembly 10 is improved. Furthermore, the heat generated from the resin layer 22 in forming the second through holes 23 is efficiently released to the ceramic substrate 11 side through the resin layer 22. Thus, the possibility to reduce the processing accuracy of the resin layer 22 due to the effect of heat is eliminated, and the guide pins 24 can be supported in high alignment accuracy.

[Third Embodiment]

Figure 14:
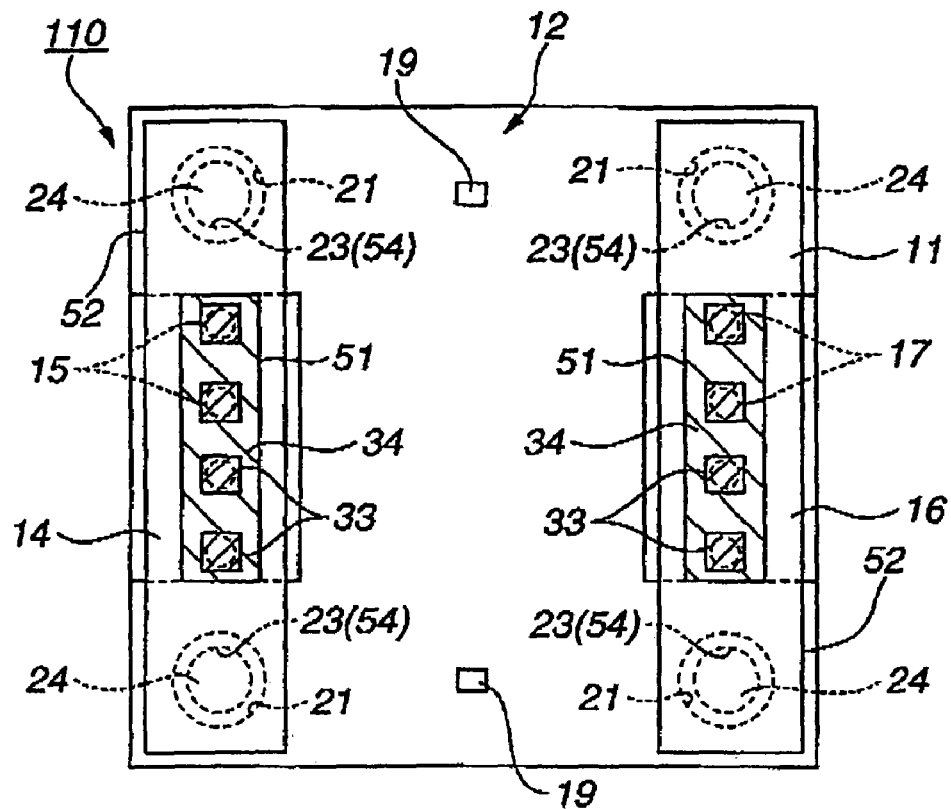
FIG. 14 is a schematic plan view illustrating an optical fiber connector equipped optical device mounted substrate assembly according to a third embodiment of the present invention.
Figure 15:
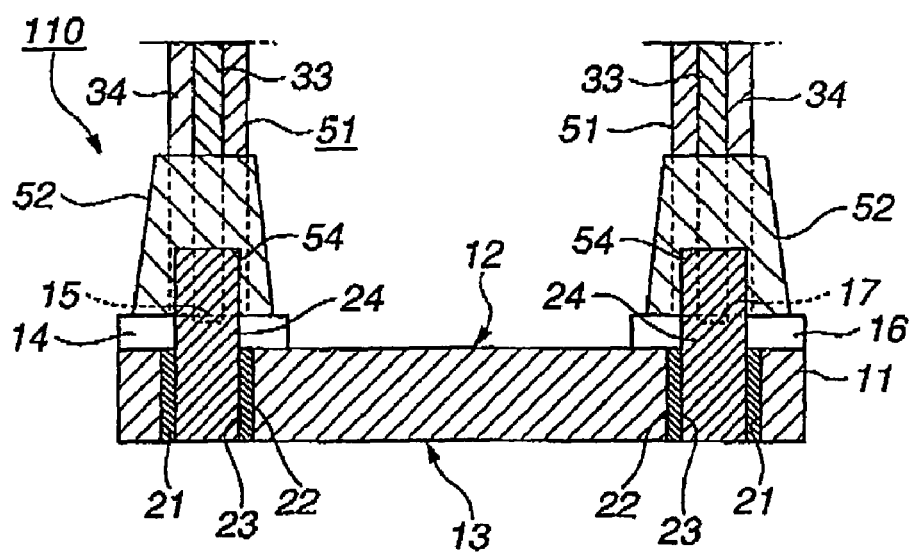
FIG. 15 is a schematic cross-sectional view of the optical fiber connector equipped optical device mounted substrate assembly.
Figure 16:
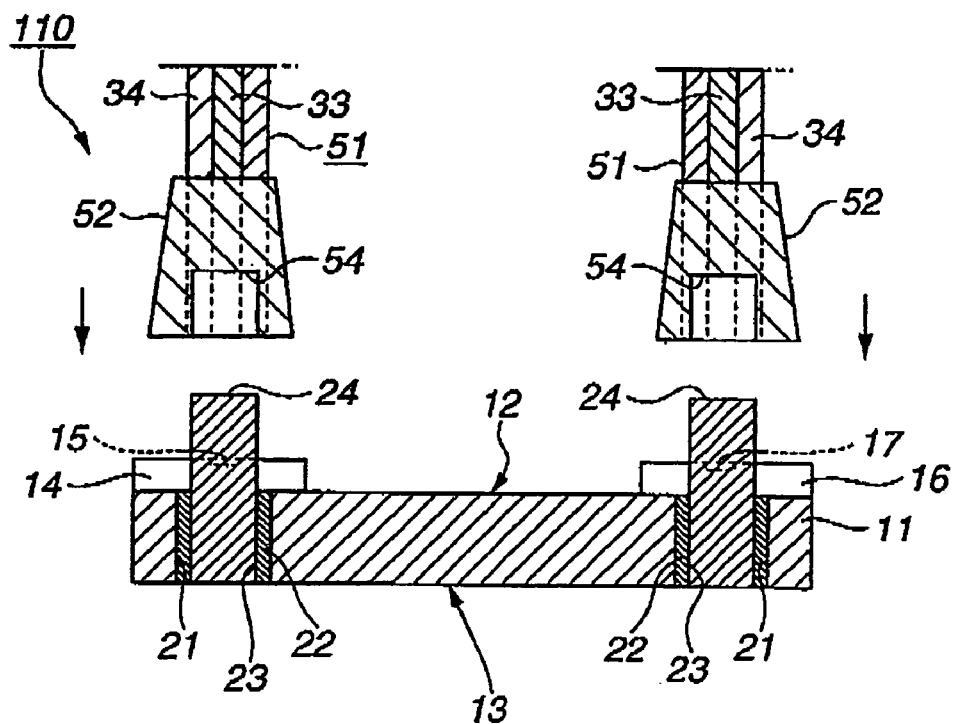
FIG. 16 is a schematic cross-sectional view illustrating a state that optical fiber connectors are fixed as a ceramic substrate is aligned with the optical fiber connectors in the fabrication process of the optical fiber connector equipped optical device mounted substrate assembly.

FIGS. 14 to 16 depict an optical fiber connector equipped optical device mounted substrate assembly 110 of a third embodiment that the invention is made concrete. Here, the points different from the first embodiment will be described, but the same points as the first embodiment are only designated the same component numbers.

As shown in FIGS. 14 and 15, an optical fiber connector 52 of the optical fiber connector equipped optical device mounted substrate assembly 110 is a so-called MT connector disposed at the tip end of an optical fiber 51 of a multicore structure (four cores in FIG. 14). The end face (that is, the end of each of cores 33) of the optical fiber 51 is exposed in the lower end face of the optical fiber connector 52. A pair of alignment holes 54 opened in the lower end face is disposed at both ends in the lower end face of the optical fiber connector 52. Then, guide pins 24 of a ceramic substrate 11 are fitted in the alignment holes 54. Consequently, the optical fiber connector 52 on the left side is fixed to a top surface 12 of the ceramic substrate 11 as the optical axes are aligned with a VCSEL 14. The optical fiber connector 52 on the right side is fixed to the top surface 12 of the ceramic substrate 11 as the optical axes are aligned with a photodiode 16.

Also in the embodiment with the configuration, the same advantages as those of the first embodiment can be exerted.

[Fourth Embodiment]

Figure 17:
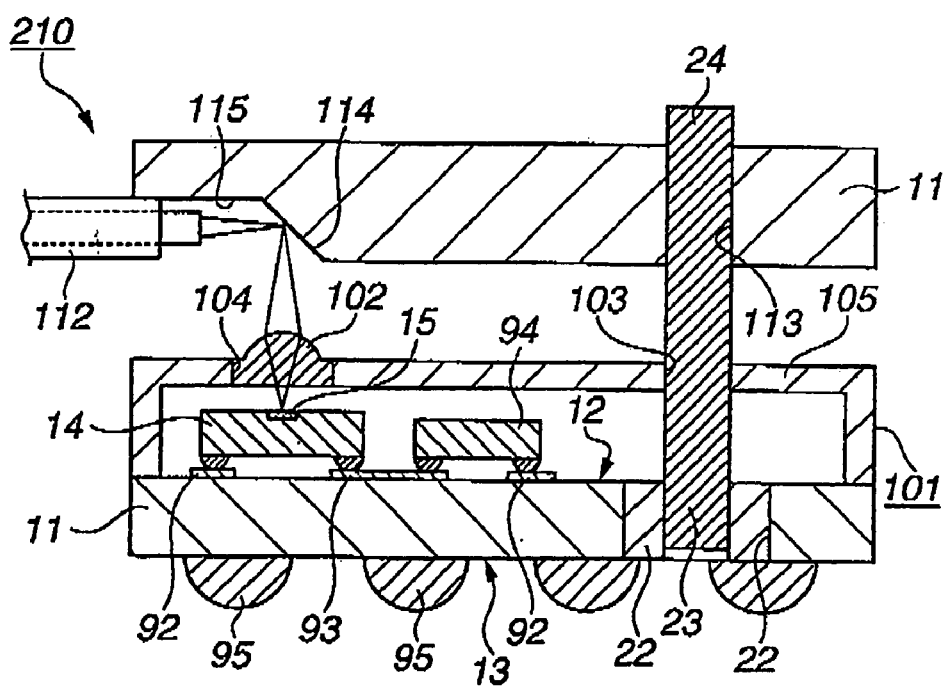
FIG. 17 is a schematic cross-sectional view illustrating an optical fiber connector equipped optical device mounted substrate assembly according to a fourth embodiment of the present invention.
Figure 18:
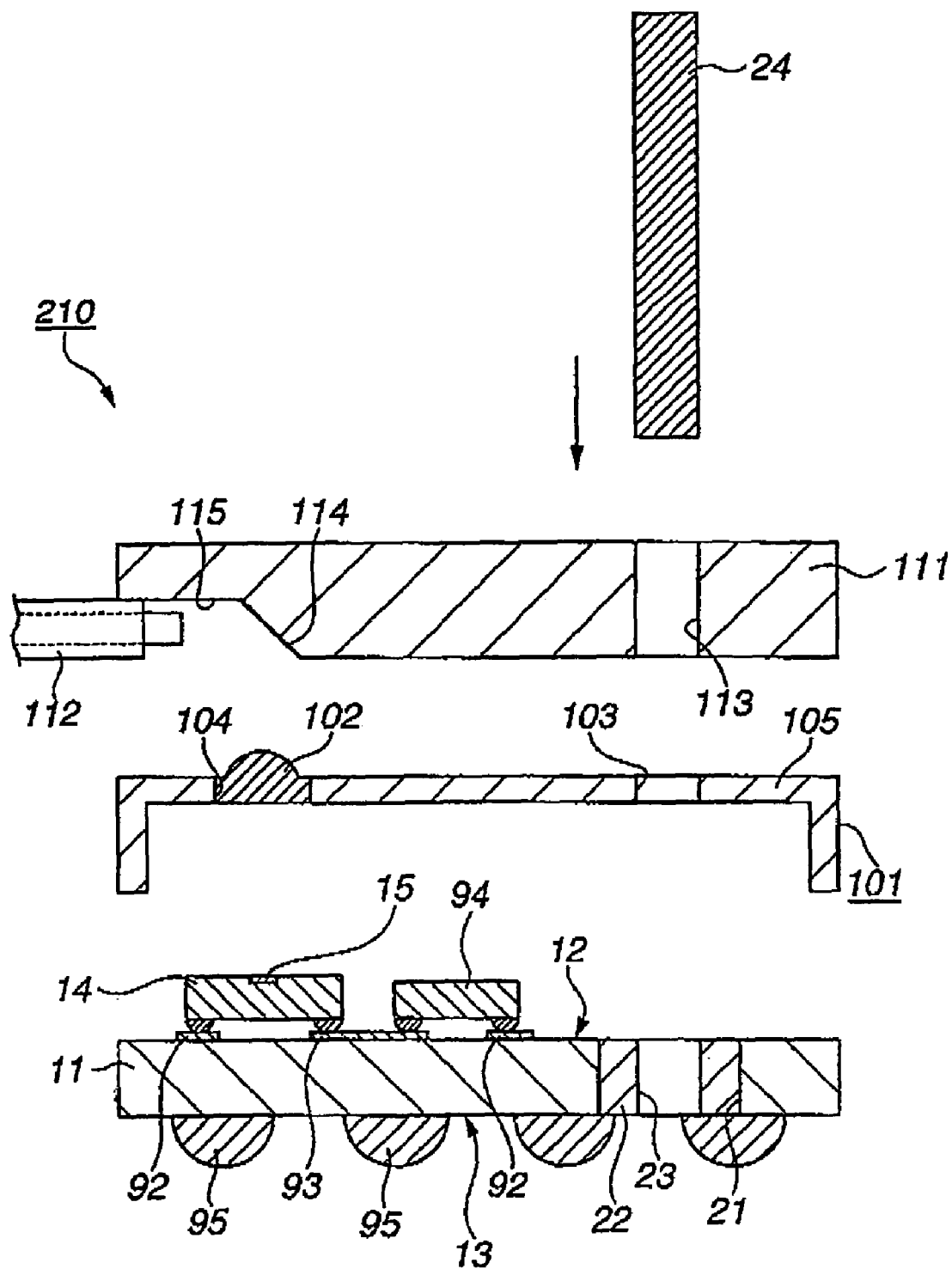
FIG. 18 is a schematic cross-sectional view illustrating a manner that components are fixed as a ceramic substrate, a microlens array and the optical fiber connector are aligned with each other in the fabrication process of optical fiber connector equipped optical device mounted substrate assembly.
Figure 19:
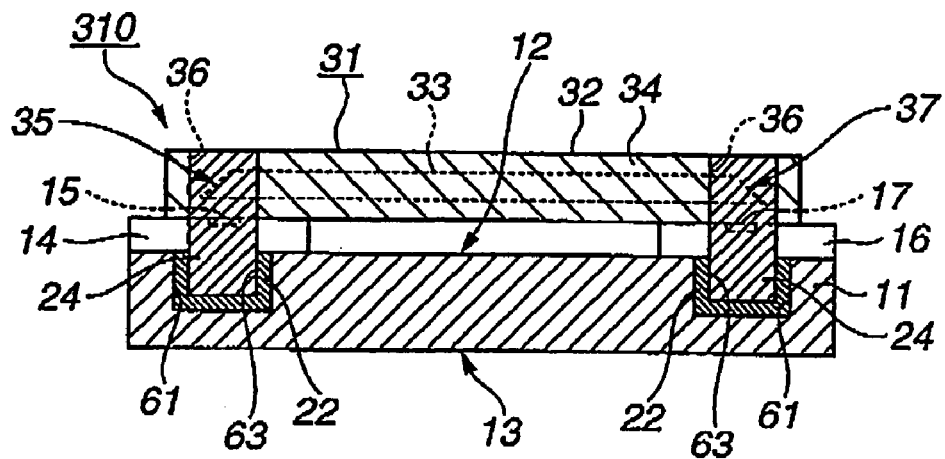
FIG. 19 is a schematic plan view of an optical waveguide equipped optical device mounted substrate assembly according to a fifth embodiment of the present invention.
Figure 20:
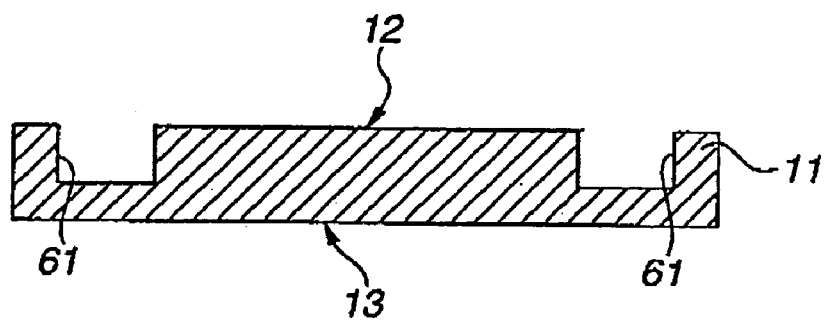
FIG. 20 is a schematic cross-sectional view illustrating a ceramic substrate formed with first non-through holes in the fabrication process of the optical waveguide equipped optical device mounted substrate assembly of the fifth embodiment.
Figure 21:
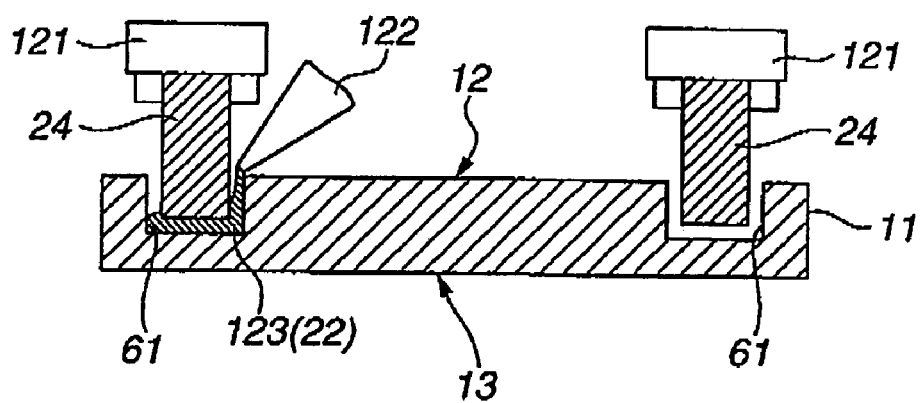
FIG. 21 is a schematic cross-sectional view illustrating a state of conducting a resin layer forming and a guide member mounting step in the fabrication process of the optical waveguide equipped optical device mounted substrate assembly.
Figure 22:
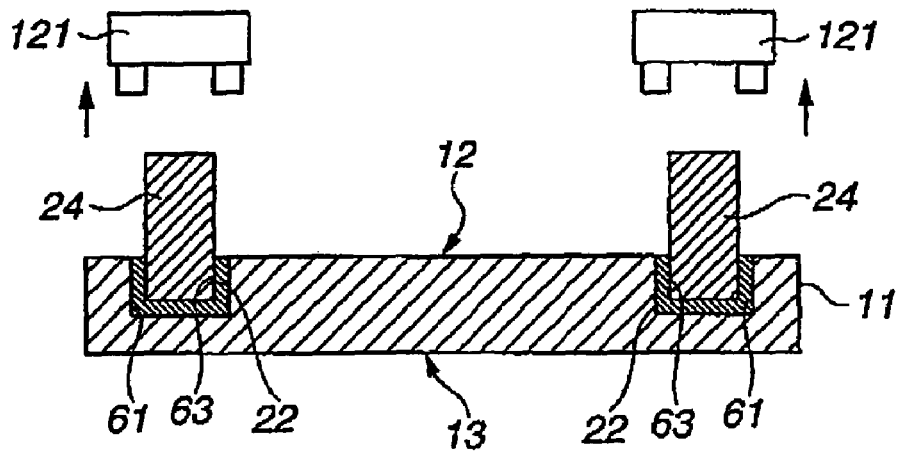
FIG. 22 is a schematic cross-sectional view illustrating a state that the resin layer forming and the guide member mounting step is completed in the fabrication process of the optical waveguide equipped optical device mounted substrate assembly.
Figure 23:
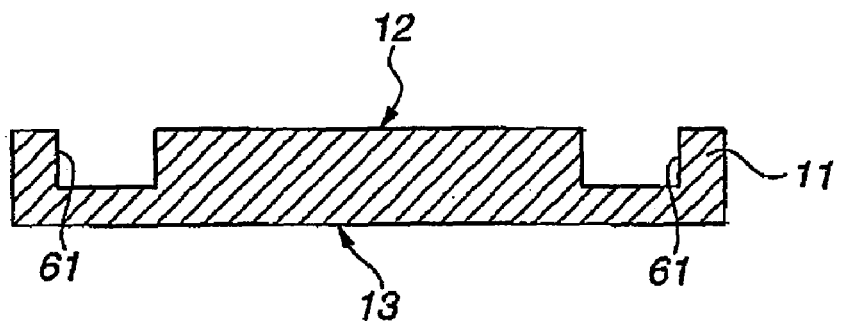
FIG. 23 is a schematic cross-sectional view illustrating the ceramic substrate formed with the first non-through holes in the fabrication process of the optical waveguide equipped optical device mounted substrate assembly according to the fifth embodiment of the present invention.
Figure 24:
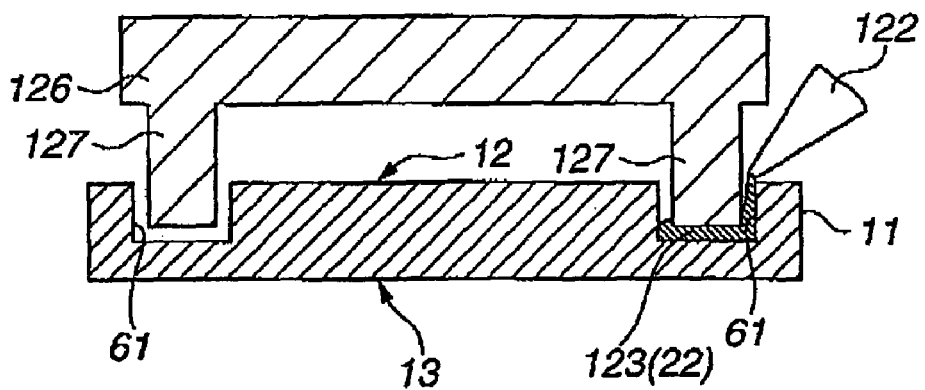
FIG. 24 is a schematic cross-sectional view illustrating a state of conducting a resin layer forming step and a second perforating step with a mold in the fabrication process of the optical waveguide equipped optical device mounted substrate assembly.
Figure 25:
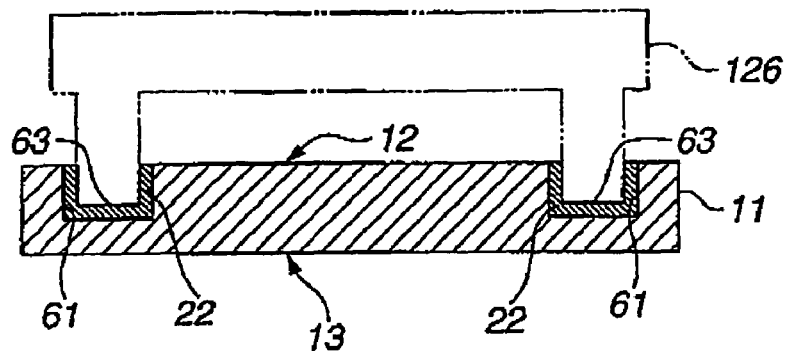
FIG. 25 is a schematic cross-sectional view illustrating a state that the resin layer forming step and the second perforating step are completed in the fabrication process of the optical waveguide equipped optical device mounted substrate assembly.
Figure 26:
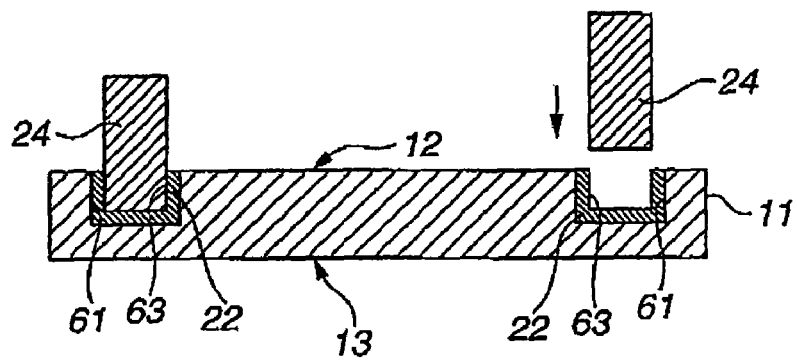
FIG. 26 is a schematic cross-sectional view illustrating a state that guide pins are fitted in second non-through holes in the fabrication process of the optical waveguide equipped optical device mounted substrate assembly.

FIGS. 17 and 18 depict an optical fiber connector equipped optical device mounted substrate assembly (substrate assembly for supporting an optical component equipped with another optical component) 210 according to a fourth embodiment of the present invention. FIG. 17 is a schematic cross-sectional view illustrating the optical fiber connector equipped optical device mounted substrate assembly 210. FIG. 18 is a schematic cross-sectional view illustrating a state that components are fixed as a ceramic substrate 11, a microlens array 101, and an optical fiber connector 111 are aligned with each other in the fabrication process of the optical fiber connector equipped optical device mounted substrate assembly 210.

As shown in FIGS. 17 and 18, the optical fiber connector equipped optical device mounted substrate assembly 210 of the embodiment is configured of a VCSEL 14 (optical device), the ceramic substrate 11 (substrate), the microlens array 101, the optical fiber connector 111, and a guide pin 24 (alignment guide member).

The ceramic substrate 11 is a nearly rectangular plate member having a top surface 12 (front surface) and an under surface 13. This ceramic substrate 11 is a so-called multilayer circuit board having metal interconnect layers. For example, a plurality of connecting pads 92 for mounting various electronic devices is formed on a part of a metal interconnect layer 93 on the top surface 12 (front surface). Not shown in the drawings, the metal interconnect layers are also formed in the inner layers of the ceramic substrate 11. The ceramic substrate 11 also has via hole conductors (omitted in the drawing), and the metal interconnect layers are in interlayer connection through the via hole conductors. Furthermore, a plurality of solder bumps 95 for connecting to the via hole conductors is formed on the under surface 13 of the ceramic substrate 11.

The VCSEL 14 (optical device), which is one kind of optical device (light emitting device), is mounted on the top surface 12 of the ceramic substrate 11 as the emission surface is faced upward. The VCSEL 14 has a plurality (here, four) of the light emitting portions 15 arranged in a row in the emission surface. Therefore, the light emitting portions 15 emit a predetermined wavelength of laser beams in the direction orthogonal to the top surface 12 of the ceramic substrate 11 (that is, toward the top of FIGS. 17 and 18). A plurality of terminals of the VCSEL 14 is joined to the connecting pads 92 disposed on the top surface 12 of the ceramic substrate 11. Moreover, instead of the light emitting device like the VCSEL 14, the configuration of mounting a light receiving device like a photodiode is acceptable, but the detailed description is omitted here.

Besides, an active circuit IC 94 (so-called driver IC) for driving the VCSEL 14 is disposed near the VCSEL 14 on the top surface 12 of the ceramic substrate 11. A plurality of terminals of the active circuit IC 94 is joined to the connecting pads 92 disposed on the top surface 12 of the ceramic substrate 11. Thus, the VCSEL 14 is electrically connected to the active circuit IC 94 through the metal interconnect layer 93.

As shown in FIGS. 17 and 18, a first through hole 21 is disposed as the first recess in the area where electronic devices are not mounted on the ceramic substrate 11. In addition, not shown in the drawings specifically, the first through hole 21 is disposed at two places in the embodiment. The first through holes 21 are circular in the same cross sections, and are opened in the top surface 12 (front surface) and the under surface 13 of the ceramic substrate 11. In the embodiment, the diameter of the first through hole 21 is formed to be about 1.0 to 2.0 mm. A resin layer 22 is provided inside the first through holes 21, and second through holes 23 (second recesses and substrate side alignment recesses) are provided at almost the center part of the resin layer 22. The second through holes 23 are circular in the same cross sections, and opened in the top surface 12 (front surface) and the under surface 13 of the ceramic substrate 11. In the embodiment, the diameter of the second through hole 23 is smaller than the first through hole 21, and formed to be about 0.7 mm. One end of the guide pin 24 (alignment guide member) made of stainless steel in a circular cross section is fitted in the two second through holes 23 (see FIG. 17). More specifically, guide pin CNF125A-21 (the diameter is 0.699 mm) defined by JIS C 5981 is used in the embodiment.

As shown in FIGS. 17 and 18, the microlens array 101 disposed on the top surface 12 (front surface) of the ceramic substrate 11 has a lid-shaped microlens array main body 105 having a housing recess on the bottom surface. The microlens array main body 105 is a resin product, in which a microlens mounting hole 104 is formed above the VCSEL 14. A convex microlens 102 made of a transparent resin material is mounted in the microlens mounting hole 104. An alignment hole 103 (microlens array side alignment recess) is formed at another place in the microlens array main body 105 as it penetrates through front and back sides. In the embodiment, the diameter of the alignment hole 103 is formed to be about 0.7 mm. Then, the guide pin 24 is inserted and fit into the alignment hole 103 like this. In addition, the microlens array 101 of the embodiment can be understood as the optical component having the light condensing function. It will do to configure the microlens 102 and the microlens array main body 105 as different products, but it is also acceptable to form them as one piece.

As shown in FIGS. 17 and 18, the optical fiber connector 111 disposed above the microlens array 101 is mounted at the tip end of an optical fiber 112. A notch 115 having an inclined plane at an angle of about 45° is disposed in the under part of the optical fiber connector 111 at the left end. An optical path switching mirror 114 (optical path switching part) made of a metal thin film that reflects light is formed in the inclined plane of the notch 115. For example, the optical fiber connector 111 having the notch 115 can be shaped by molding with a synthetic resin material, and can also be shaped by etching with a metal material such as silicon. The optical fiber connector 111 formed with the optical path switching mirror 114 of the embodiment can also be understood as the optical component having the light reflecting function (that is, the optical path switching component).

A plurality of the alignment holes 113 (optical component side alignment recesses) is formed at predetermined positions in the optical fiber connector 111 so as to penetrate through front and back sides. In the embodiment, the diameter of the alignment hole 113 is formed to be about 0.7 mm. Then, the guide pins 24 are inserted and fit into these alignment holes 113.

In the optical fiber connector equipped optical device mounted substrate assembly 210 thus configured, the ceramic substrate 11, the microlens array 101, and the optical fiber connector 111 are fixed to each other and aligned with each other by fitting of the guide pips 24. Here, more specifically, 'being aligned' is a state that the optical axis of each of the light emitting portions 15 of the VCSEL 14, the optical axis of each of the microlens 102, and the optical axis of each of the cores of the optical fiber 112 are aligned with each other.

The general operations of the optical fiber connector equipped optical device mounted substrate assembly 210 thus configured will be described briefly.

The VCSEL 14 is operable by power supply from the ceramic substrate 11 side. When electrical signals are outputted from the active circuit IC 94 on the ceramic substrate 11 to the VCSEL 14, the VCSEL 14 converts the inputted electrical signals to optical signals (laser beams), and emits the optical signals from the light emitting portions 15 upward. The optical signals having been emitted from the light emitting portions 15 travel as they are spreading, they are condensed when passing through the microlens 102, and then they reach the optical path switching mirror 114. The optical signals having entered the optical path switching mirror 114 change the traveling direction there at an angle of 90°, and enter one end of the optical fiber 112. Furthermore, a photodiode, not shown, is disposed near the other end of the optical fiber 112, and the optical signals finally reach the photodiode.

Next, a fabrication method of the optical fiber connector equipped optical device mounted substrate assembly 210 will be described.

First, a silicon base material is etched to form the notch 115 with the inclined plane. Then, gold is sputtered onto the inclined plane to form the optical path switching mirror 114. Furthermore, the silicon base material undergoes precision drilling to form the alignment, through holes 113 penetrating through the front and back sides thereof. Since the silicon base material is not so hard as ceramic materials, holes can be formed highly accurately by precision drilling relatively easily. Subsequently, the end of the optical fiber 112 is joined to the notch 115 of the optical fiber connector 111 thus formed. In addition, it will do to conduct precision drilling for the silicon base material before the step of forming the optical path switching mirror 114. Besides, it is acceptable to form the optical path switching mirror 114 by techniques other than sputtering (for example, vacuum deposition and CVD)

In the meantime, after the microlens array main body 105 is fabricated by molding with a synthetic resin, and the microlens array main body 105 undergoes precision drilling to form the alignment through holes 103 penetrating through the front and back sides thereof. Since the synthetic resin materials are not so hard as the ceramic materials in general, holes can be formed highly accurately by precision drilling relatively easily. It will do to form the microlens mounting hole 104 in precision drilling, but it is acceptable to form it in molding. Then, the microlens 102 is mounted in the microlens mounting hole 104 to complete the microlens array 101.

Moreover, the ceramic substrate 11 is fabricated in accordance with the following procedures. Alumina powder, an organic binder, a solvent, and a plasticizer are uniformly mixed and kneaded to form row material slurry, and a doctor blade apparatus is used to shape a sheet with the row material slurry to form a green sheet in a predetermined thickness. The green sheet is punched at predetermined places, and a metal paste for forming via hole conductors is filled in the holes formed. Besides, a metal paste is printed on the surface of the green sheet to form a printed layer to be the metal interconnect layer later. Subsequently, a plurality of the green sheets is laminated and pressed into one piece, and a green sheet layered product is formed. After that, the green sheet layered product is punched to form the first through holes 21 (first recesses) (a first perforating step). Since it is unsintered at this stage, holes can be bored relatively easily at low coats. In the first perforating step, perforating is performed so that the inner diameter of the first through hole 21 (first recess) after a firing step is greater than the inner diameter (about 0.7 mm) of the second through hole 23 (the second recesses and the substrate side alignment recesses) and the diameter (about 0.7 mm) of the guide pin 24. More specifically, the first through holes (first recesses) 21 are set to about 1.2 to 2.4 mm. This is because the first through holes 21 (first recesses) need to be greater in the consideration of shrinkage of the ceramic material after the firing step which causes the first through holes 21 (first recesses) to become smaller in diameter and move out of position. Then, after a drying step and a degreasing step are conducted in accordance with well-known techniques, the firing step is conducted at temperatures that alumina can be sintered. Accordingly, the green sheet layered product (unsintered ceramic product) is sintered to form the ceramic substrate 11. At this point of time, the ceramic is hardened and shrunk.

In a subsequent resin layer forming step, the resin layer 22 is formed in the first through holes 21 (first recesses) as below. First, 5 parts by weight of a curing agent (2P4MZ-CN made by Shikoku Corp.), 200 parts by weight of a silica filler (TSS-6 made by Tatsumori) treated with a silane coupling agent (KBM-403 made by Shin-Etsu Chemical Co., Ldt.), and an anti-foaming agent (BERENOL S-4 made by SAN NOPCO LIMITED) are mixed to 80 parts by weight of bisphenol F epoxy resin (Epikote 807 made by JER Co. Ltd.) and 20 parts by weight of a cresol novorac epoxy resin (Epikote 152 made by JER Co., Ltd.). The mixture is kneaded with triple rolls to form a resin material for forming the resin layer 22. That is, an uncured resin material containing an inorganic filler in a thermosetting resin is used in the embodiment.

Subsequently, the ceramic substrate 11 is set in a printing apparatus, and a predetermined metal mask (omitted in the drawing) is placed and contacted to the top surface 12. In this metal mask, openings are formed beforehand at places corresponding to the first through holes 21. The resin material is printed through the metal mask like this, and the resin material is fully filled in each of the first through holes 21 with no space. After that, the printed ceramic substrate 11 is removed from the printing apparatus, it is heated at a temperature of 120° C. for one hour to cure the resin layer 22 formed by filling the resin material to some extent (it is partially cured). Here, the reason why the resin layer 22 is not fully cured is that perforating in a second perforating step is conducted more easily.

In the subsequent second perforating step, precision drilling with a precision drill is conducted to form the second through holes 23 (the second recesses and the substrate side alignment recesses) in the resin layer 22. According to this machining, the second through holes 23 can be formed which can support the guide pins 24 to be the reference in the optical axis alignment at desired right positions.

After that, a full curing step in which the ceramic substrate 11 is heated at a temperature of 150° C. for five hours is conducted to fully cure the resin layer 22. Furthermore, known finish machining is conducted for fine adjustment of the second through holes 23, thereby adjusting the diameter of the second hole 23 to 0.700 mm. More specifically, the accuracy required for machining at this time is ±0.001 mm.

A solder paste is printed onto the connecting pads 92 on the top surface 12 of the ceramic substrate 11, and then the VCSEL 14 and the active circuit IC 94 are mounted for reflow. Consequently, terminals of the connecting pads 94, the VCSEL 14, and the active circuit IC 94 are joined through the solder.

In a subsequent guide member fitting step, the guide pins 24 are first pressed to fit in the second through holes 23 (the second recesses and the substrate side alignment recesses) with a jig for exclusive use.

In a subsequent alignment step, each of the guide pins 24 extended from the ceramic substrate 11 is fitted in the alignment holes 103 (optical component side alignment recesses) of the microlens array 101. Accordingly, the microlens array 101 is fixed to the ceramic substrate 11 as the optical axis alignment of each of the light emitting portions 15 of the VCSEL 14 with each of the microlenses 102 is conducted. At this time, it is acceptable to reliably join the interface between the microlens array 101 and the ceramic substrate 11 with an adhesive. Furthermore, each of the guide pins 24 is fitted in each of the alignment holes 113 (optical component side alignment recesses) of the optical fiber connector 111. Thus, the optical axes of each of the light emitting portions 15 of the VCSEL 14, each of the microlenses 102, and each of the cores of the optical fiber 112 are aligned with each other, and the optical fiber connector 111 is fixed to the ceramic substrate 11. Then, the optical fiber connector equipped optical device mounted substrate assembly 210 of the embodiment is completed as described above.

Therefore, the embodiment can obtain the following advantages.

(1) The embodiment is configured in which the fitting relationship between the guide pins 24 fitted in the second through holes 23 and the alignment holes 103 and 113 achieves the optical axis alignment and the ceramic substrate 11, the microlens array 101, and the optical fiber connector 111 are fixed to each other. Thus, the optical axes are aligned more positively and highly accurately than the traditional passive optical axis alignment that relies only on the self-alignment effect in reflow. Therefore, the optical fiber connector equipped optical device mounted substrate assembly 210 is small in optical transmission loss and sufficiently ready for high speed and high density optical communication. Furthermore, since the ceramic substrate with thermal conductivity 11 higher than that of the resin substrate, is used, the heat generated from the VCSEL 14 and the active circuit IC 94 is dissipated efficiently. Accordingly, the optical fiber connector equipped optical device mounted substrate assembly 210 excellent in stable operations and reliability can be realized in which a drift in the emission wavelength caused by a deterioration of heat dissipation can also be avoided.

(2) According to the fabrication method of the embodiment, the optical fiber connector equipped optical device mounted substrate assembly 210 with the configuration described above can be fabricated reliably at low costs.

[Fifth Embodiment]

Next, an optical waveguide equipped optical device mounted substrate assembly (substrate assembly for supporting an optical component equipped with another optical component) 310 according to a fifth embodiment of the present invention will be described with reference to FIGS. 19 to 26.

In the first embodiment, the first through holes 21 are formed as the first recesses and the second through holes 23 are formed as the second recesses. However in the embodiment, first non-through holes 61 are formed as the first recesses and second non-through holes 63 are formed as the second recesses. The other configurations are the same. Hereinafter, a fabrication method of the optical waveguide equipped optical device mounted substrate assembly 310 will be described.

(First Fabrication Method)

First, a ceramic substrate 11 is fabricated in accordance with the procedures of the first embodiment. Here, a green sheet layered product is drilled to form the first non-through holes 61 (first recesses) at predetermined places (a first perforating step). Since it is unsintered in this stage, holes can be bored relatively easily at low costs. Then, after a drying step and a degreasing step are conducted in accordance with well-known techniques, a firing step is conducted at temperatures that alumina can be sintered. Accordingly, the green sheet layered product (unsintered ceramic product) is fired to form the ceramic substrate 11 (see FIG. 20). At this point of time, the ceramic is hardened and shrunk.

Subsequently, the upper ends of a plurality of guide pins 24 being the alignment guide members are held and fixed by chucks 121 being guide member holding jigs. Then, the guide pins 24 are held as the lower ends of the held guide pins 24 are inserted into the first non-through holes 61. At this time, the guide pins 24 are aligned highly accurately in the X-Y direction. Furthermore, a dispenser 122 is used to fill an uncured resin material 123 in the first non-through holes 61 (see FIG. 21). In the embodiment, the uncured resin material containing an inorganic filler in a thermosetting resin is used as similar to the first embodiment. Then, the filled resin material 123 is heated and cured, and then the holding by the chucks 121 is released. Consequently, a resin layer 22 having the second non-through hole 63 can be disposed at almost the center part thereof, and the guide pins 24 can be supported on the second non-through holes 63 (see FIG. 22, a resin layer forming and a guide member mounting step).

Therefore, according to the first fabrication method, since the resin layer forming step and the guide member mounting step are conducted at the same time, the number of process steps is more reduced than the fabrication method of the first embodiment. Accordingly, it is significantly advantageous for realizing cost reductions.

In addition, in the first fabrication method, it will do to use guide member holding jigs other than the chucks 121. Furthermore, it is acceptable to use units other than the dispenser 122 in filling the uncured resin material 123 in the first non-through holes 61. Moreover, the following modification is also possible. That is, the uncured resin material 123 is first filled in the first non-through holes 61, and then the lower ends of the guide pins 24 are inserted and held in the first non-through holes 61. In this order, the guide pins 24 do not become obstacles in filling the resin material 123, thus allowing a broad variety of choices for methods of filling the resin material 123. Accordingly, it is possible to adopt a technique of printing, for example.

(Second Fabrication Method)

First, a ceramic substrate 11 is fabricated in accordance with the procedures of the first embodiment. Here, the green sheet layered product is drilled to form the first non-through holes 61 (first recesses) at predetermined places (a first perforating step). Since it is unsintered at this stage, holes can be bored relatively easily at low costs. Subsequently, after a drying step and a degreasing step are conducted, in accordance with well-known techniques, a firing step is conducted at temperatures that alumina can be sintered. Accordingly, the green sheet layered product (unsintered ceramic product) is fired to form the ceramic substrate 11 (see FIG. 23). At this point of time, the ceramic is hardened and shrunk.

Then, a mold 126 being a spacer member is prepared. The mold 126 has a plurality of pins 127 corresponding to the shape of the guide pins 24 (see FIG. 24). Subsequently, the ceramic substrate 11 and the mold 126 are aligned in the X-Y direction highly accurately, the lower ends of the pins 127 are inserted into the first non-through holes 61, and then the mold 126 is held. Furthermore, a dispenser 122 is used to fill an uncured resin material 123 in the first non-through holes 61. In the embodiment, the uncured resin material containing an inorganic filler in a thermosetting resin is used as similar to the first embodiment. Then, the filled resin material 123 is heated and cured, and then the mold 126 is pulled up and removed. Consequently, the resin layer 22 having the second non-through hole 63 is formed at almost the center part thereof (see FIG. 25, a resin layer forming step and a second perforating step). Lastly, the guide pins 24 are pressed into each of the second non-through holes 63 for fitting and supporting (see FIG. 26, a guide member fitting step).

Therefore, according to the second fabrication method, since the resin layer forming step and the second perforating step are conducted at the same time, the process steps are more reduced than the fabrication method of the first embodiment. Accordingly, it is significantly advantageous for realizing cost reductions.

In addition, it will do to use a unit other than the dispenser 122 in filling the uncured resin material 123 in the first non-through holes 61 in the second fabrication method. Furthermore, the following modification is possible. That is, the uncured resin material 123 is first filled in the first non-through holes 61, and then the lower ends of the pins 127 of the mold 126 are inserted and held in the first non-through holes 61. In this order, the mold 126 does not become an obstacle in filling the resin material 123, thus allowing a broad variety of choices for methods of filling the resin material 123. Accordingly, it is possible to adopt a technique of printing, for example.

[Sixth Embodiment]

Figure 27:
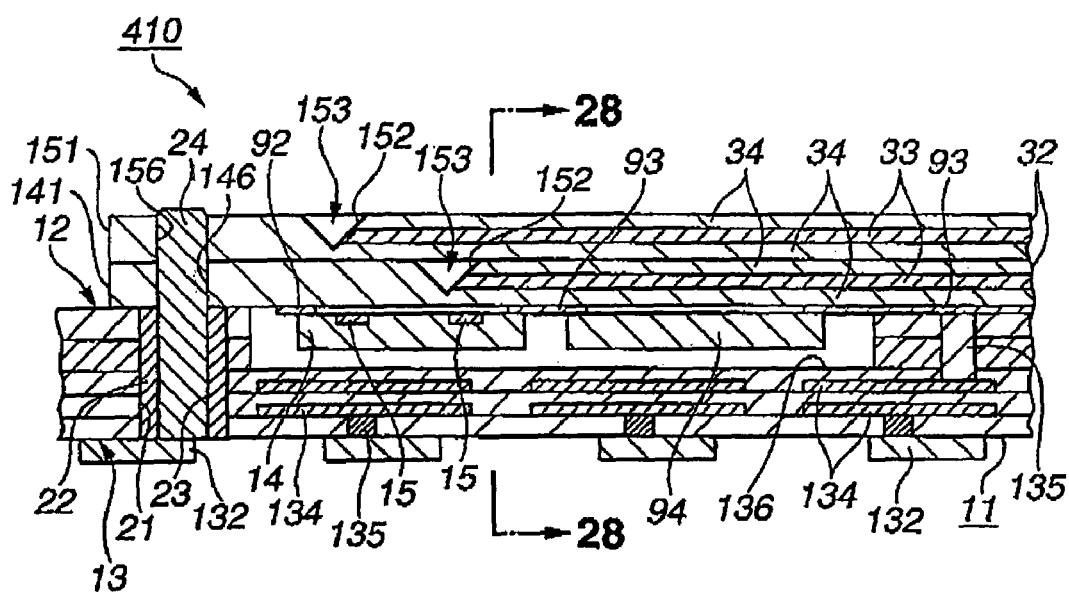
FIG. 27 is a schematic cross-sectional view illustrating an optical waveguides equipped optical device mounted substrate assembly of a sixth embodiment.
Figure 28:
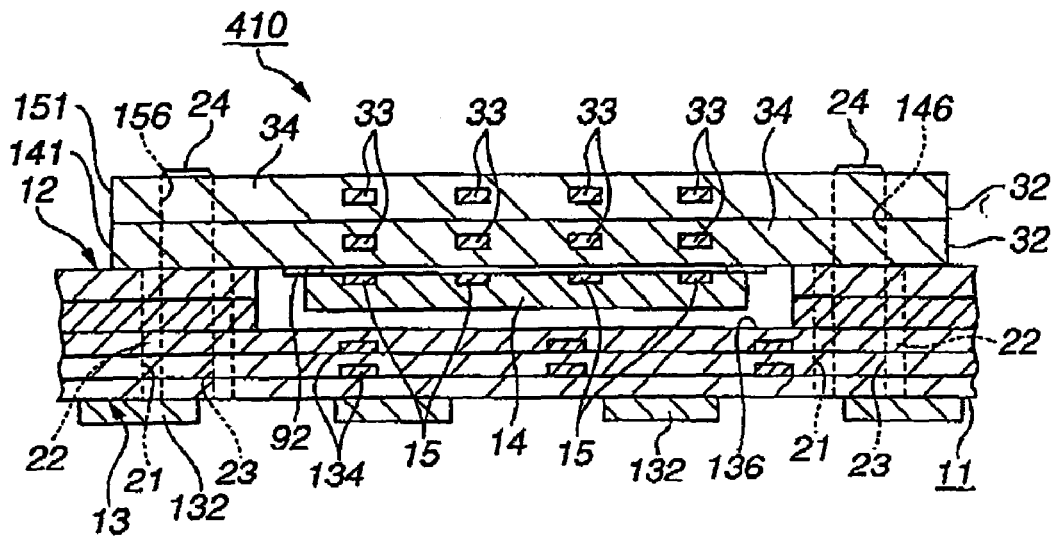
FIG. 28 is a cross-sectional view taken along line 28—28 of FIG. 27.
Figure 29:
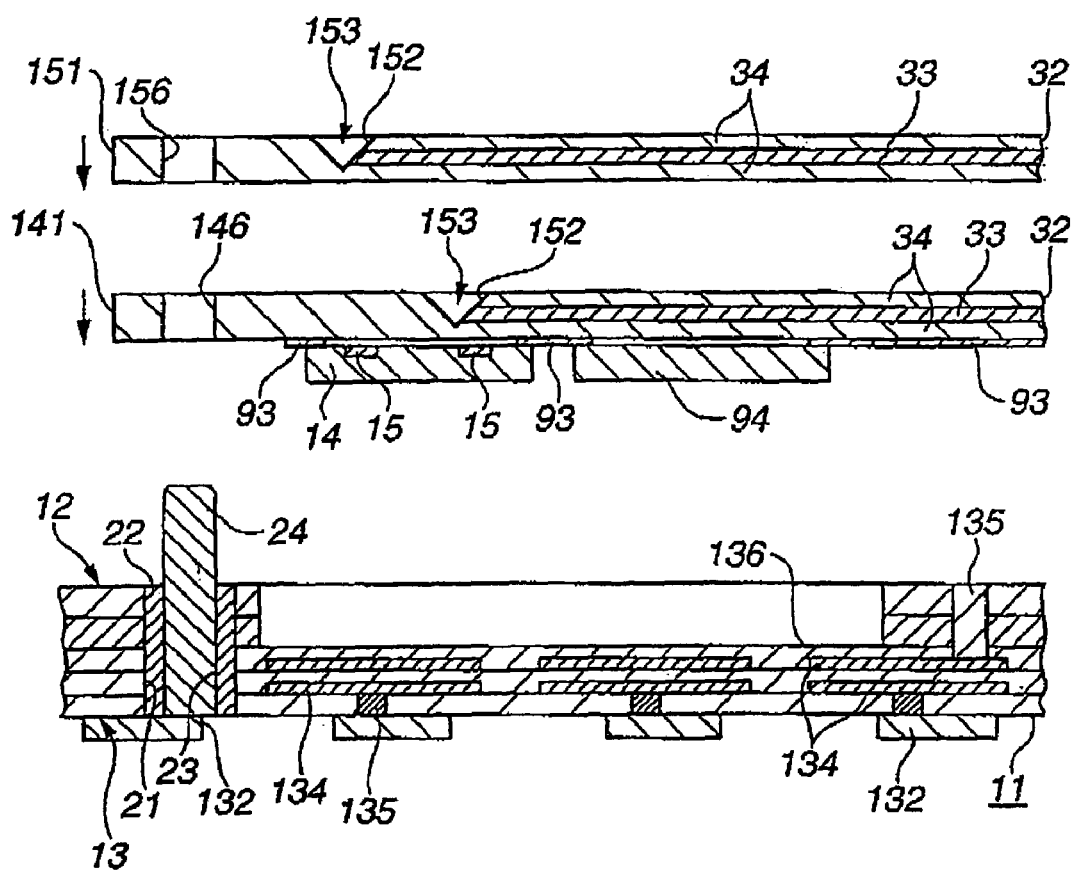
FIG. 29 is a schematic cross-sectional view illustrating a manner that components are fixed as a ceramic substrate, an under side optical waveguide, and an upper side optical waveguide are aligned with each other in the fabrication process of the optical device mounted substrate assembly.

FIGS. 27 to 29 depict an optical waveguide equipped optical device mounted substrate assembly (substrate assembly for supporting an optical component equipped with another optical component) 410 according to a sixth embodiment of the present invention. FIG. 27 is a schematic cross-sectional view illustrating the optical waveguide equipped optical device mounted substrate assembly 410. FIG. 28 is a cross-sectional view taken along line 28—28 of FIG. 27. FIG. 29 is a schematic cross-sectional view illustrating a state that components are fixed as a ceramic substrate 11, an under side optical waveguide 141, and an upper side optical waveguide 151 are aligned with each other in the fabrication process of the optical waveguide equipped optical device mounted substrate assembly 410.

As shown in FIGS. 27 and 28, the optical waveguide, equipped optical device mounted substrate assembly 410 of the embodiment is configured of a VCSEL 14 (optical device), the ceramic substrate 11 (substrate), the under side optical waveguide 141 (optical component), the upper side optical waveguide 151 (optical component), and guide pins 24 (alignment guide members). In addition, the VCSEL 14 of the embodiment has two light emitting rows formed of four light emitting portions 15.

The ceramic substrate 11 is a nearly rectangular plate member having a top surface 12 (front surface) and an under surface 13. This ceramic substrate 11 is a so-called multi-layer circuit board, and has metal interconnect layers (that is, wiring patterns 134 and via hole conductors 135) inside thereof. A cavity 136 being a chip housing part is disposed at almost the center of the top surface 12. In the meantime, a plurality of external connecting terminals 132 is formed on the under surface 13. First through holes 21 are formed as the first recesses in the outer region of the ceramic substrate 11, and a resin layer 22 is formed in the first through holes 21, A second through hole 23 (the second recess and the substrate side alignment recess) is formed at almost the center part of the resin layer 22, and the guide pins 24 are fitted in the second through holes 23.

The under side optical waveguide 141 is placed and contacted to the top surface 12 of the ceramic substrate 11. A base material 32 configuring the under side optical waveguide 141 has cores 33 and a cladding 34. A V-groove 153 having an interior angle of about 90° is formed at a predetermined area of the base material 32, and a thin film 152 made of a metal which can, total-reflect the light is deposited on the inner surface (inclined plane) of the V-groove 153. Consequently, an optical path switching mirror for switching the traveling direction of light emitted from the VCSEL 14 at an angle of about 90° is formed. This optical path switching mirror is disposed right above one of the light emitting rows of the VCSEL 14. Moreover, alignment holes 146 (optical component side alignment recesses) are penetrated through in the outer region of the base material 32 configuring the under side optical waveguide 141. The guide pins 24 are inserted and fit into the alignment holes 146.

Wiring layers (connecting pads 92 and metal interconnect layers 93) are formed on the under surface of the under side optical waveguide 141. Furthermore, the VCSEL 14 (optical device), which is one kind of optical device (light emitting device), and an active circuit IC 94 (so-called driver IC) are mounted on the under surface of the under side optical waveguide 141. Therefore, the light emitting portions 15 of the VCSEL 14 are disposed upward, and laser beams enter from the under surface of the under side optical waveguide 141 in emission. Since the under side optical waveguide 141 is basically a transparent material, the incident laser beams can travel through the top surface of the under side optical waveguide 141. In addition, the VCSEL 14 and the active circuit IC 94 are disposed as they are housed in the cavity 136. It will do to fill a silicon oil between the under surfaces of the VCSEL 14 and the active circuit IC 94 and the bottom surface of the cavity 136 for enhanced heat dissipation. In the embodiment, the under side optical waveguide 141 can be understood as the support that directly supports the optical device. In addition, the ceramic substrate 11 can also be understood as the substrate that indirectly supports the optical device through the under side optical waveguide 141.

The upper side optical waveguide 151 is placed and contacted to the top surface of the under side optical waveguide 141. A base material 32 configuring the upper side optical waveguide 151 has cores 33, a cladding 34, and an optical path switching mirror having a thin film 152 deposited on a V-groove 151. However, the optical path switching mirror of the upper side optical waveguide 151 is disposed at the position different from the position of the optical path switching mirror of the under side optical waveguide 141, more specifically, it is disposed right above the other of the light emitting rows of the VCSEL 14. That is, in the embodiment, the optical path switching mirror of the under side optical waveguide 141 and the optical path switching mirror of the upper side optical waveguide 151 are shifted in the direction in parallel to the under surface (more specifically, in the longitudinal direction of the cores 33) so as not to overlap each other when seen from the under surface of the under side optical waveguide 141, for example. Thus, the interference of incident light can be avoided, and the optical coupling of each of the cores 33 to the VCSEL 14 is not hampered. Moreover, the alignment holes 156 (optical component side alignment recesses) are penetrated through in the outer region of the base material 32 configuring the upper side optical waveguide 151. The guide pins 24 are inserted and fit into the alignment holes 156.

In the embodiment, the ceramic substrate 11, the under side optical waveguide 141, and the upper side optical waveguide 151 are fixed as they are aligned with each other by fitting of the guide pins 24. Here, more specifically, 'being aligned' is a state that the optical axis of each of the light emitting portions 15 of the VCSEL 14 is aligned with the optical axis of each of the cores 33 of the under side optical waveguide 141 and the upper side optical waveguide 151.

Therefore, according to the embodiment, the following advantage is exerted.

(1) The embodiment is configured in which the fitting relationship of the guide pins 24 achieves the optical axis alignment and the ceramic substrate 1I, the under side optical waveguide 141, and the upper side optical waveguide 151 are fixed to each other. Thus, the optical axes are aligned more positively and highly accurately than the traditional passive optical axis alignment that relies only on the self-alignment effect in reflow. Therefore, the optical waveguide equipped optical device mounted substrate assembly 410 is small in optical transmission loss and sufficiently ready for high speed and high density optical communication. Furthermore, since the ceramic substrate with thermal conductivity 11 higher than that of the resin substrate is used, the heat generated from the VCSEL 14 and the active circuit IC 94 is dissipated efficiently. Accordingly, the optical waveguide equipped optical device mounted substrate assembly 410 excellent in stable operations and reliability can be realized in which a drift in the emission wavelength caused by a deterioration of heat dissipation can also be avoided.

MODIFIED EXAMPLE

Figure 30:
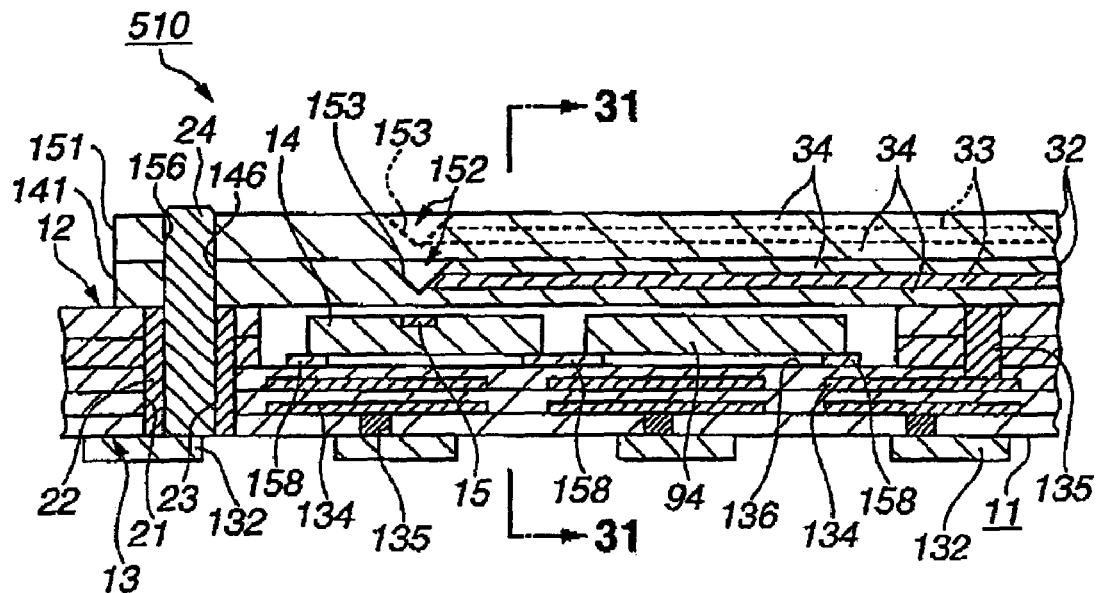
FIG. 30 is a schematic cross-sectional view illustrating an optical waveguide equipped optical device mounted substrate assembly that is a modification of the sixth embodiment.
Figure 31:
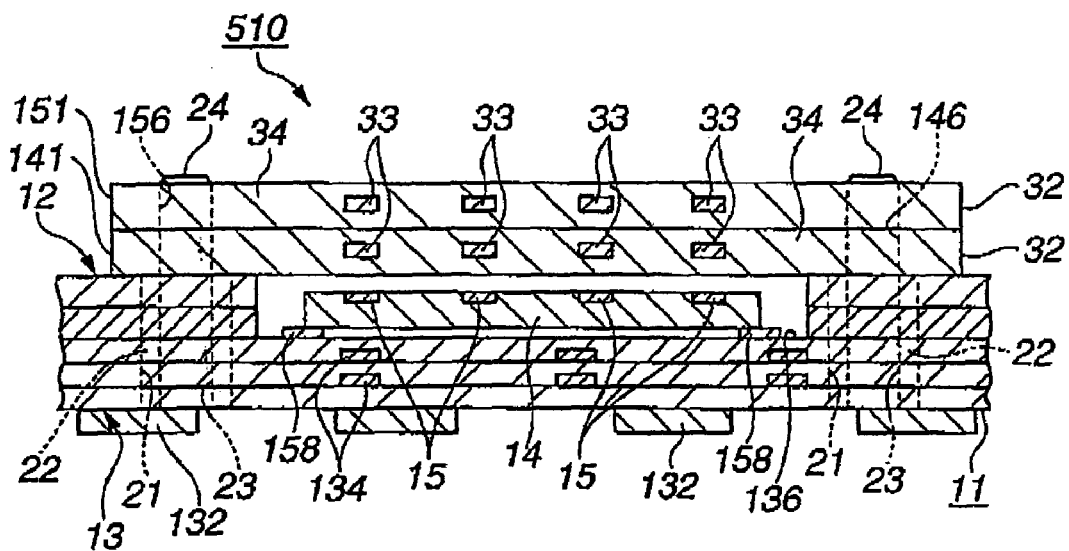
FIG. 31 is a cross-sectional view taken along line 31—31 of FIG. 30.

FIGS. 30 and 31 depict a modified example of the optical waveguide equipped optical device mounted substrate assembly (substrate assembly for supporting an optical component equipped with another optical component) 510 according to the sixth embodiment of the present invention. FIG. 30 is a schematic cross-sectional view illustrating an optical waveguide equipped optical device mounted substrate assembly 510 of the modified example. FIG. 31 is a cross-sectional view taken along line 31—31 of FIG. 30.

In the optical waveguide equipped optical device mounted substrate assembly 510, the wiring layers (the connecting pads 92 and the metal interconnect layer 93) of the under side optical waveguide 141 are omitted, and instead, connecting pads 158 are disposed on the bottom surface of a cavity 136. A VCSEL 14 and an active circuit IC 94 are soldered on the connecting pads 158. Furthermore, each of cores 33 of an upper side optical waveguide 151 and each of cores 33 of an under side optical waveguide 141 are shifted in the width direction of the cores 33 so as not to overlap each other when observed from the under surface (see FIG. 31). Moreover, a shift in this case is set to a half of the distance between the center lines of the cores 33. Therefore, the interference of incident light and outgoing light can also be avoided in the modified example, and the optical coupling of each of the cores 33 to the VCSEL 14 is not hampered.

[Seventh Embodiment]

Figure 32:
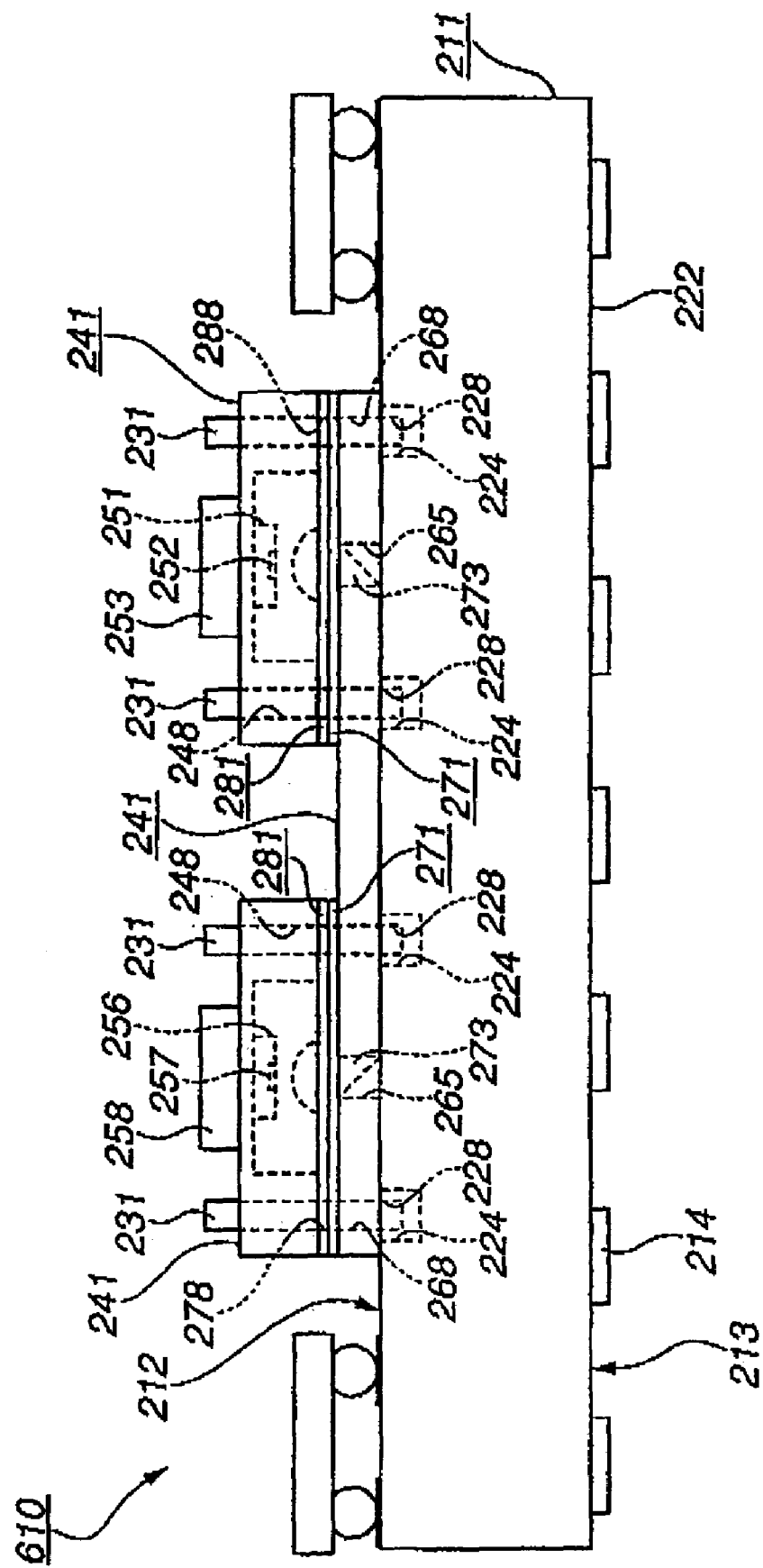
FIG. 32 is a schematic side view of a photoelectric composition circuit structure according to a seventh embodiment of the present invention.

FIG. 32 depicts a photoelectric composite circuit structure 610 according to a seventh embodiment of the present invention. The photoelectric composite circuit structure 610 is configured of a plurality of components; an optical interposer 241 (optical device mounted substrate assembly), an electric circuit board 11, an optical waveguide layer 261, an optical path switching component 271, a microlens array 281, and a guide pin 231 (alignment guide member).

Figure 33:
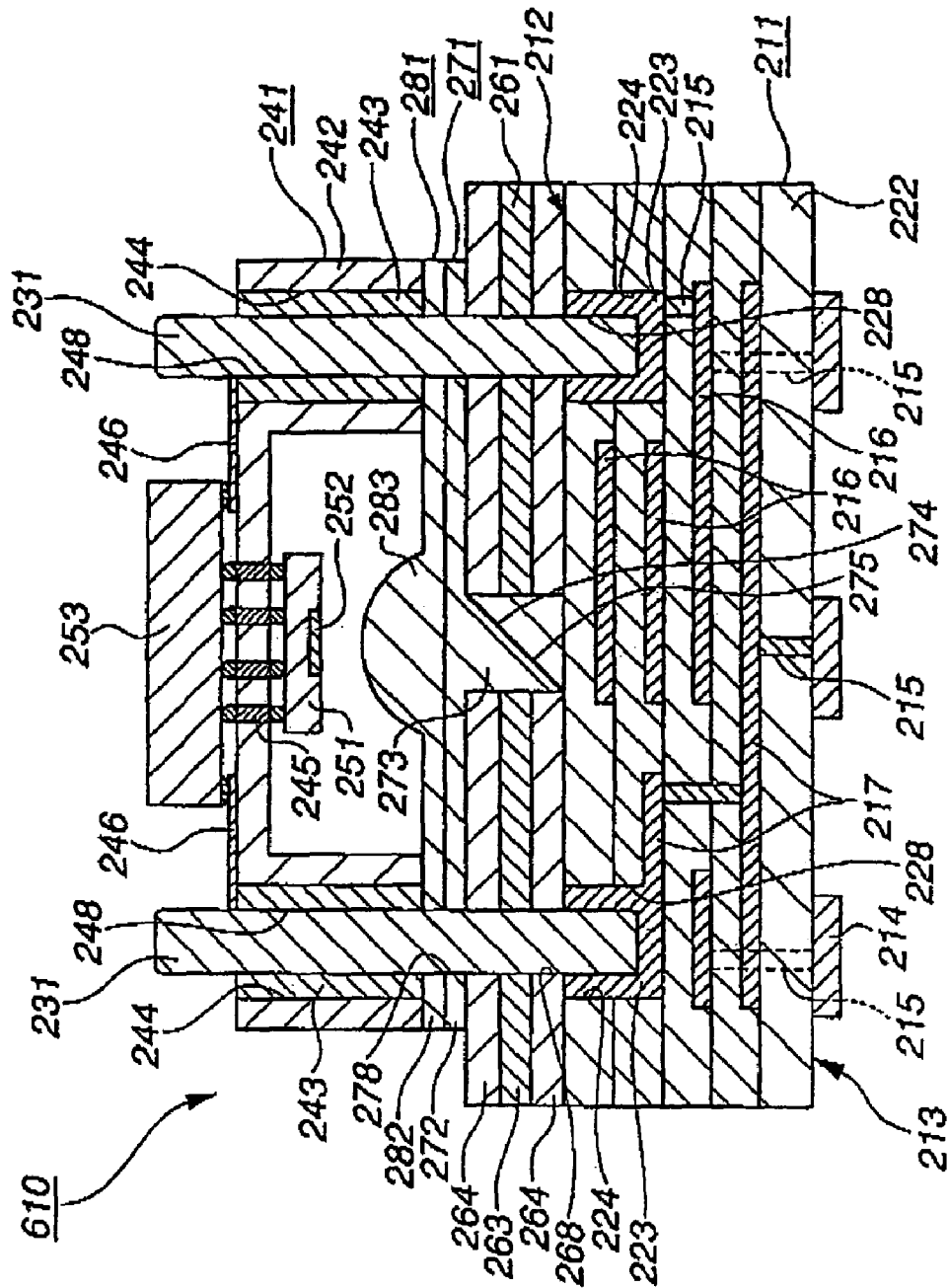
FIG. 33 is an enlarged, schematic cross-sectional view of the photoelectric composition circuit structure.

As shown in FIG. 33, the electric circuit board 211 is formed of an electric circuit board main body 222, which is a nearly rectangular plate having a top surface 212 and an under surface 213. This electric circuit board 211 is a so-called ceramic multilayer circuit board, having conductor circuits 216 and 217 on the top surface 212 and in the inner layers. The conductor circuit 216 is a signal layer, and the conductor circuit 217 is a power source layer. The electric circuit board 211 has via hole conductors 215 for interlayer connection. A plurality of connecting pads 214 is disposed on the under surface 213 of the electric circuit board main body 222.

As shown in FIGS. 32 and 33, first recesses 224 are disposed at a plurality of places in the electric circuit board main body 222. The first recesses 224 are circular in the same cross section, and opened only in the top surface 212 of the electric circuit board main body 222. In the embodiment, the diameter of the first recess 224 is formed to be about 1.0 to 2.0 mm. Furthermore, four first recesses 224 are disposed on both of the emission side and the light receiving side in the embodiment.

A conductive filling product 223 (second recess forming part) is filled in the first recesses 224. In the embodiment, the conductive filling product 223 is formed of a tungsten paste for forming via hole conductors. Moreover, the conductor circuits 217 allocated as the power source layer are electrically connected to the conductive filling product 223 placed on the left side in FIG. 33 in the inner layer of the electric circuit board 11. The conductor circuits 216 allocated as the signal layer are electrically connected to the conductive filling product 223 placed on the right side in FIG. 33 through the via hole conductors 215 in the inner layer of the electric circuit board 211.

An Alignment hole 228 being a second recess (electric circuit board side alignment recess) is disposed at almost the center part of the conductive filling product 223. The alignment hole 228 is circular in the same cross section, and opened only in the top surface 212 of the electric circuit board main body 222. In the embodiment, the diameter of the alignment hole 228 is smaller than that of the first recess 224 and formed to be about 0.7 mm. The guide pins 231 (alignment guide members) made of stainless steel circular in the cross section are fit and supported on eight alignment holes 228 as one ends thereof are extended from the top surface. More specifically, guide pin CNF125A-21 (the diameter is 0.699 mm) defined by JIS C 5981 is used in the embodiment. In the meantime, since the guide pins are made of stainless steel, they have preferable strength and conductivity.

Figure 34:
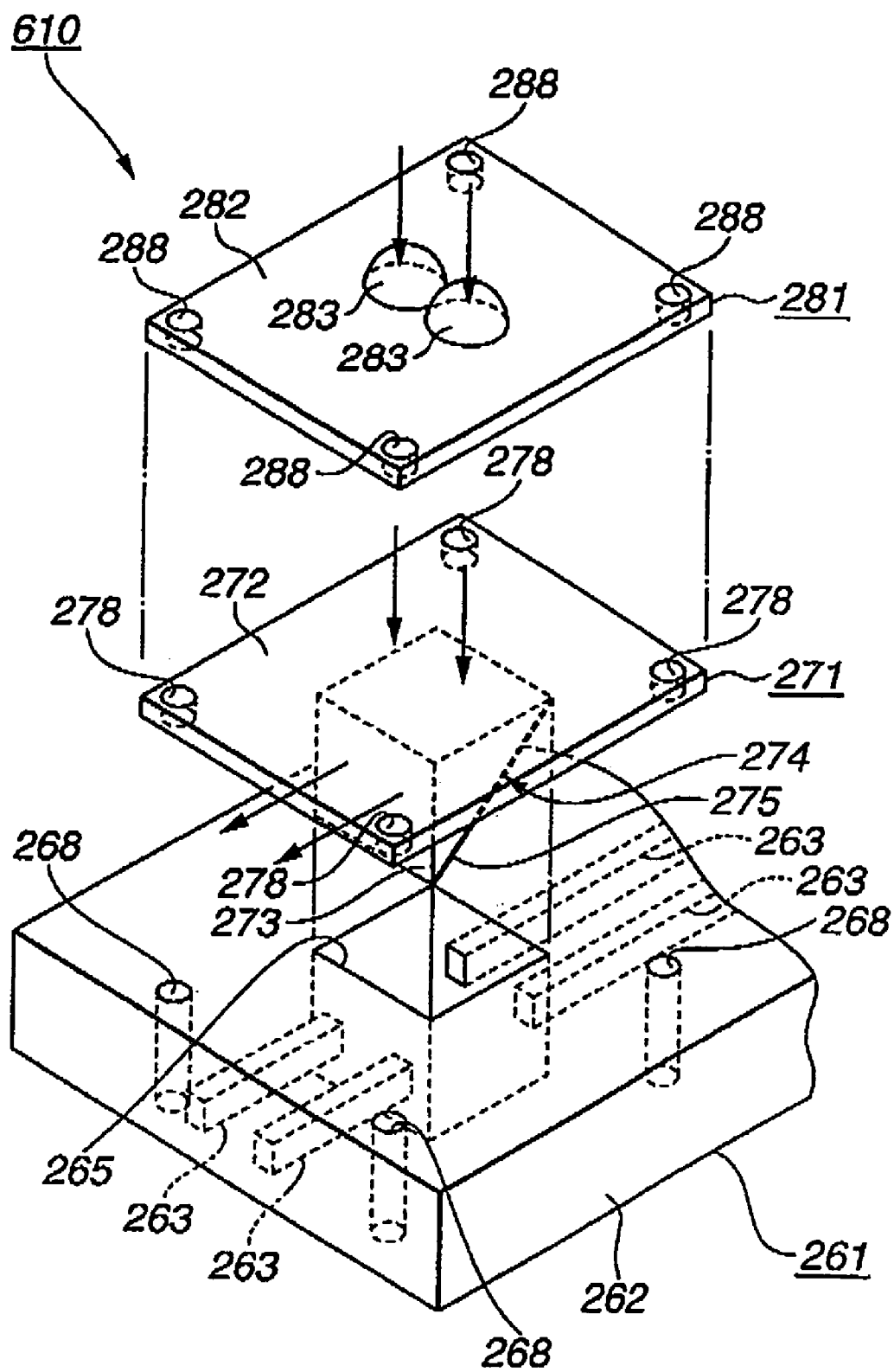
FIG. 34 is a schematic, exploded perspective view of an optical waveguide layer and a microlens array of the photoelectric composition circuit structure.

As shown in FIGS. 32, 33 and 34, the optical waveguide layer 261 is disposed on the top surface 212 of the electric circuit board 211. The optical waveguide layer 261 is formed of an organic optical waveguide layer main body 262, having an under layer cladding 264, cores 263, and an upper layer cladding 264. The cores 263 are substantially the portions to be optical paths through which optical signals propagate, and are surrounded by the under layer cladding 264 and the upper layer cladding 264. In the embodiment, the claddings 264 and the cores 263 are formed of transparent polymer materials with different refraction indexes, more specifically, PMMA (polymethyl methacrylate) with different refraction indexes. Such PMMA has thermosetting properties. As shown in FIG. 34, the cores 263 to be optical paths are two in the embodiment, which are formed to extend straight and in parallel. In addition, it is acceptable that the number of the cores 263 is a single, or three or more. The material to form the cores 263 is formed to have the refraction index a few percent higher than that of the material to form the claddings 264. The thicknesses of the claddings 264 and the cores 263 are formed to be about a few tens μm. Consequently, the thickness of the optical waveguide layer main body 262 is about 150 to 200 μm.

A component insertion hole 265 is penetrated in the midway of the cores 263, which is opened in the top surface and the under surface of the optical waveguide main body 262. The component insertion hole 65 of the embodiment is formed so as to cross (stretch across) the two cores 263 (see FIG. 34). One of the component insertion holes 265 is placed right under the optical interposer 241 on the emission side, and the other of the component insertion holes 265 is placed right under the optical interposer 241 on the light receiving side. Furthermore, the shape of the component insertion hole 265 seen from the thickness direction of the optical waveguide layer 261 is nearly rectangular, and the dimension of one side thereof is formed to be about 150 μm. Moreover, the depth of the component insertion hole 65 is formed to be about 150 to 200 μm.

Circular alignment holes 268 (optical waveguide layer side alignment recesses) are formed at a plurality of places in the optical waveguide layer main body 262, which penetrate through the top surface and the under surface. The alignment holes 268 are formed to have a diameter of about 0.7 mm corresponding to the size of the guide pins 31. Then, each of the guide pins 231 are fit and supported on each of the alignment holes 268.

In addition, FIGS. 32 to 34 depict the optical path switching component 271 used in the embodiment. The optical path switching component 271 is disposed between the optical waveguide layer 261 and the microlens array 281. An optical path switching component main body 272 configuring the optical path switching component 271 is a flat plate member having a top surface and an under surface and made of an optically transparent material (it is PMMA in the embodiment). A projection 273 in a right triangular cross section insertable into the component insertion hole 265 is formed in one piece at almost the center part of the under surface of the optical path switching component main body 272. The shape of the projection 273 seen from the thickness direction of the optical path switching component main body 272 is nearly rectangular, which is formed equal to the shape of the component insertion hole 265 seen from the same direction. A metal film 275 as a light reflector is formed on an inclined plane 274 of the projection 273 at an angle of about 45°. In the embodiment, shiny rhodium is used to form the metal film 275 having a thickness of about 0.1 to 10 μm. This metal film 275 can fully reflect light. The height of the projection 273 is formed to be about 150 to 200 μm nearly equal to the depth of the component insertion hole 265.

Circular alignment holes 278 (optical path switching component side alignment recesses) are formed at four corners of the optical path switching component main body 272, which penetrate through the top surface and the under surface. The alignment holes 278 are formed to have a diameter of about 0.7 mm corresponding to the size of the guide pins 231. Then, each of the guide pins 231 is fit and supported on each of the alignment holes 278.

Furthermore, FIGS. 32 to 34 depict the microlens array 281 used in the embodiment. The microlens array 281 is disposed between the optical path switching component 271 and the optical interposer 241. A microlens array main body 282 configuring the microlens array 281 is a flat plate member having a top surface and an under surface, and made of an optically transparent material (it is PMMA in the embodiment). Two hemispherical microlenses 283 having a diameter of bout 100 μm are formed in one piece at almost the center part of the top surface of the microlens array main body 282.

Circular alignment holes 288 (microlens side alignment recesses) are formed at four corners of the microlens array main body 282, which penetrate through the top surface and the under surface. The alignment holes 288 are formed to have a diameter of about 0.7 mm corresponding to the size of the guide pins 231. Then, each of the guide pins 231 is fit and supported on each of the alignment holes 288.

Moreover, FIGS. 32 to 34 depict the optical interposers 241 in the embodiment. The optical interposers 241 are disposed on the top surface of the microlens array main body 282. As shown in FIG. 33, the optical interposer 241 is formed of an optical interposer main body 242 of a nearly rectangular plate having a top surface and an under surface.

This optical interposer main body 242 is a ceramic circuit board having a cavity on the under surface with via hole conductors 245 and conductor circuits 246. An optical device is mounted in the cavity on the under surface of the optical interposer main body 242 as its face down. More specifically, a VCSEL 251, which is one kind of light emitting device, is mounted on the optical interposer 241 on the emission side, and a photodiode 256, which is one kind of light receiving device, is mounted on the optical interposer 241 on the light receiving side.

The VCSEL 251 is mounted as the emission surface is faced downward, and has a plurality (here, two) of light emitting portions 252 arranged in a row in the light emitting surface. Therefore, the light emitting portions 252 emit a predetermined wavelength of laser beams toward the bottom of FIGS. 32 and 33. The photodiode 256 is mounted as the light receiving surface is faced downward, and has a plurality (here, two) of light receiving portions 257 arranged in a row in the light receiving surface. Therefore, the light receiving portions 257 are configured to easily receive laser beams traveling from the bottom to the top of FIG. 32.

In the meantime, a driver IC 253 is mounted at almost the center part of the top surface of the optical interposer 241 on the emission side as its face up. The driver IC 253 and the VCSEL 251 are conducted to each other through the via hole conductors 245 being high-speed signal transmitting parts. A receiver IC 258 is mounted at almost the center part of the top surface of the optical interposer 241 on the light receiving side as its face up. The receiver IC 258 and the photodiode 256 are conducted to each other through the via hole conductors 245 being the high-speed signal transmitting parts.

As shown in FIGS. 32 and 33, first recesses 244 are disposed at four corners of the optical interposer main body 242. The first recesses 244 are circular in the same cross section, and opened in both of the top surface and the under surface of the optical interposer 241. In the embodiment, the diameter of the first recess 244 is formed to be about 1.0 to 2.0 mm.

A conductive filling product 243 (second recess forming part) is formed in the first recesses 244 by filling a tungsten paste. As shown in FIG. 33, one end of the conductor circuit 246 is connected to this conductive filling product 243. A connecting pad is formed on the other end of the conductor circuit 246, and terminals of the driver IC 253 and the receiver IC 258 are connected on the connecting pad. In the embodiment, since the conductor circuit 246 placed on the left side in FIG. 33 corresponds to the signal layer, it is connected to signal terminals of the driver IC 253 and the receiver IC 258. Since the conductor circuit 246 placed on the right side in FIG. 33 corresponds to the power source layer, it is connected to power source terminals of the driver IC 253 and the receiver IC 258.

In addition, an alignment hole 48 being a second recess (optical interposer side alignment recess) is disposed at almost the center part of the conductive filling product 243. The alignment hole 248 is circular in the same cross section, and opened in both of the top surface and the under surface of the optical interposer main body 242. In the embodiment, the diameter of the alignment hole 248 is smaller than that of the first recess 244, and formed to be about 0.7 mm. Then, each of the guide pins 231 is fit and supported on each of the alignment holes 248.

The electric circuit board 211 side and the optical interposer 241 side are conducted to each other through the conductive guide pins 231. Therefore, power can be supplied from the electric circuit board 211 side to the optical interposer 241 side. In addition, signals can be sent and received between the electric circuit board 211 and the optical interposers 241.

The components are fixed while being aligned sequentially in the following procedures.

First, the guide pins 231 are supported on the electric circuit board 211.

The guide pins 231 are pressed and fit into each of the alignment holes 228 (second recesses) of the electric circuit board 211 with a jig for exclusive use. Then, the guide pins 231 are fit and supported on each of the alignment holes 268 of the optical waveguide layer 261, and the optical waveguide layer 61 is layered on the top surface of the electric circuit board 211. Subsequently, the guide pins 231 are fit and supported on each of the alignment holes 278 of the optical path switching component 271, and the optical path switching component 271 is layered on the top surface of the optical waveguide layer 261. At this is time, a part (the projection 273) of the optical path switching component 271 is inserted into the component insertion hole 265 of the optical waveguide layer 261 as well. Consequently, the metal film 275 formed on the reflection surface 274 of the projection 273 is disposed in the midway of the cores 263, and the optical axes of the metal film 275 and the cores 263 are aligned with each other. Subsequently, the guide pins 231 are fit and supported on each of the alignment holes 288 of the microlens array 281, and the microlens array 281 is layered on the top surface of the optical path switching component 271. Consequently, the optical axes of the cores 263, the metal film 275, and the microlenses 283 are aligned with each other. Lastly, the guide pins 231 are fit and supported on each of the alignment holes 248 of the optical interposer 241, and the optical interposer 241 is layered on the top surface of the microlens array 281. As the result, the optical axes of the cores 263, the metal film 275, the microlenses 283, and the light emitting portions 252 (or the light receiving portions 257) are aligned with each other, and a desired photoelectric composite circuit structure 610 is completed.

[Eighth Embodiment]

Figure 35:
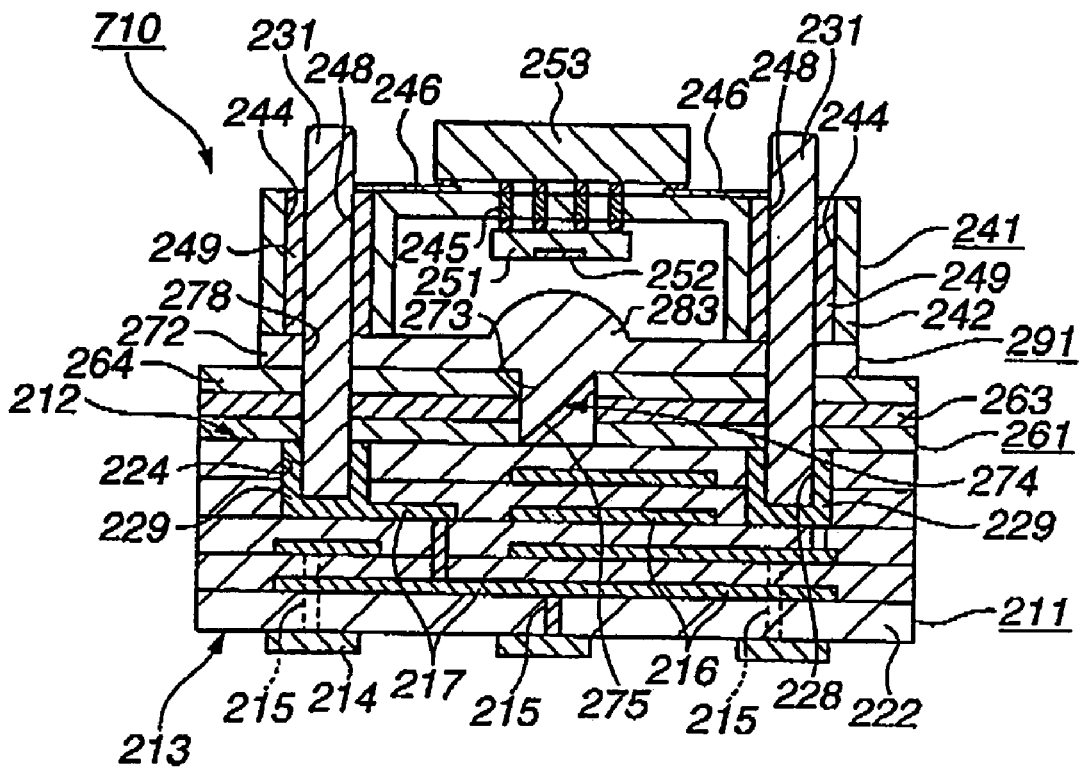
FIG. 35 is a schematic cross-sectional view of a photoelectric composition circuit structure according to an eighth embodiment of the present invention.
Figure 36:
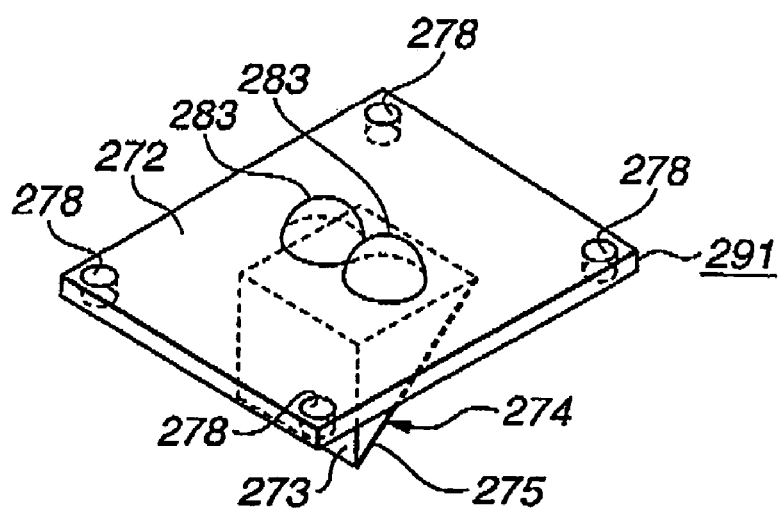
FIG. 36 is a reduced, schematic perspective view of a microlens equipped optical path switching component of the photoelectric composition circuit structure.

Then, a photoelectric composite circuit structure 710 according to an eighth embodiment of the present invention will be described with reference to FIGS. 35 and 36. In the meantime, only the different points from the seventh embodiment will be described, and like parts and portions are designated by like reference characters and will not be described in detail again.

In the seventh embodiment, the optical path switching component 271 and the microlens array 281 are formed as separate components. On the other hand, in this embodiment, a microlens equipped optical path switching component 291 (optical path switching part equipped microlens array) that is a component having the functions of both of them is used. That is, the microlens equipped optical path switching component 291 has a configuration in which the microlenses 283 are formed in one piece on the top surface of the optical path switching component main body 272 of the optical path switching component 271 in the seventh embodiment.

Therefore, according to the configuration, the entire component can be formed thinner by the space of the microlens array main body 282 because it is eliminated. Accordingly, an increase in the distance between the optical waveguide layer 261 and the optical device can be avoided, leading to the reduction in optical transmission loss. Moreover, the configuration can prevent an increase in parts counts.

In the meantime, it is acceptable to modify the above-described embodiments as follows.

(a) Finish machining can be omitted if holes can be formed highly accurately only by precision drilling or high-precision processing or machining in the second perforating step.

(b) In the first embodiment, the step of mounting the VCSEL 14 and the photodiode 16, which are the optical devices, is conducted after finish machining and before the guide member fitting step. However, it is not limited to this; it will do to conduct the optical device mounting step after the guide member fitting step, or before finish machining.

(c) In the sixth embodiment, the optical waveguides 141 and 151 are used as the optical components having the optical transmission function and the light reflecting function, but instead, it will do to use optical components having the optical transmission function such as an optical fiber connector for configuration. Furthermore, it is acceptable to use optical components having the light condensing function such as a microlens array instead of the optical waveguides 141 and 151.

Figure 8:
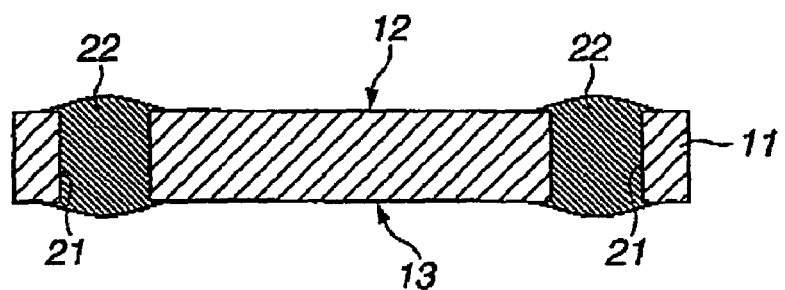
FIG. 8 is a schematic cross-sectional view illustrating a state that a resin material is filled in the ceramic substrate to form a resin layer in the fabrication process of the optical device mounted substrate assembly.

(d) In the first embodiment, as shown in FIGS. 8 to 10, the process steps are conducted in the following order, the step of burying the second recesses with the resin layer 22, the second perforating step of drilling the resin layer 22 to form the second recesses, and the step of surface-polishing and removing the excessive resin layer 22. It will do to change the order. For example, the second perforating step can be conducted before the surface polishing step. Since the flat surface is drilled in this case, the processing accuracy of the second recesses can be improved. Moreover, chipping in the openings of the second recesses is hard to occur as compared with the case where surface polishing is conducted after drilling.

(e) In the first to sixth embodiments, the resin layer 22 being the second recess forming part is formed in the first recess, and the second recess, which is a through hole or non-through hole, is formed in the resin layer 22. However, it is possible to form the second recess forming part with materials other than resins. In the first to sixth embodiments, it will do to form the second recess forming part with materials having better workability than ceramics such as alumina, which is a main material for forming the ceramic substrate 11. More specific examples are glass materials, machinable ceramics, silicon, solder materials, and conductor pastes. Here, the machinable ceramics are the ceramics that can be cut with machines. Preferred examples of the machinable ceramics are mica ceramics (artifical mica crystals are grown in glass), composite mica ceramics that glass is used for a matrix to uniformize fluorine-gold-mica-zirconia microcrystals, and products that a ceramic such as porous aluminium nitride are immersed in a resin.

(f) As shown in FIGS. 1 and 14, the optical device mounted substrate assembly (substrate assembly for supporting an optical component) preferably has positioning reference portions 19 at the front surface of the substrate. Preferably, a plurality of alignment recesses is formed with reference to the positioning reference portions 19. According to the configuration, a shift or movement in positioning can be reduced when the optical component is placed with reference to fit pins. Therefore, highly efficient connection can be realized more easily and reliably, and optical transmission loss is further reduced.

In the invention, it is also possible that the plurality of the alignment recesses has the function as the positioning reference portions in mounting of the optical device. The optical component is formed with reference to the alignment recesses, and then a shift or movement in the optical axis from the other optical component is reduced. Furthermore, when the optical device is mounted between the substrate side alignment recesses formed at least in two places, the optical device can be mounted in more improved position accuracy, contributing to reducing a shift in the optical axis.

Moreover, it is acceptable to mount the optical device with reference to the positioning reference portions 19 formed on the substrate. For example, when defects in the optical device are revealed after fitting of the fit pins, it becomes difficult to mount the optical device with reference to the alignment recesses. In this case, the optical device is mounted with reference to the positioning reference portions 19, which allows positioning of the optical device with respect to the substrate side alignment recesses and thereby allows highly accurate positioning of the optical device with respect to the other optical component. In this case, the positioning reference portion 19 is preferably formed between the second recess forming parts formed at least in two places.

More specific examples of the positioning reference portions are a part of a conductor layer formed on the front surface of the supporting substrate (a pad, for example), a mark formed by printing, a via hole conductor appearing on the front surface of the supporting substrate, and the end face of a through hole conductor. Moreover, publicly known techniques can be adopted as techniques of forming the plurality of the alignment recesses with reference to the positioning reference portions. For example, a technique is preferable that uses an image pickup unit such as a CCD camera to take an area including the positioning reference portions and analyzes the image to determine positions to form the plurality of the alignment recesses. The same technique can be adopted to the case of mounting the optical device with reference to the alignment reference parts.

Next, the technical ideas understood by the embodiments are listed.

(1) An optical device mounted substrate assembly characterized by including:

a ceramic substrate having a first front surface and a second front surface and a first through hole opened on both sides of the first front surface and the second front surface;

an optical device mounted on the first front surface of the ceramic substrate, having at least one of a light emitting portion and a light receiving portion, and optically connected to an optical waveguide or an optical fiber connector in a state that optical axes thereof are aligned with each other;

a resin layer placed in the first through hole, and having a second through hole smaller in diameter than the first through hole and opened on both sides of the first front surface and the second front surface; and an alignment guide member fitted in the second through hole and having a protruded portion protruding from the first front surface of the ceramic substrate and fittingly engageable in an alignment hole of the optical waveguide or the optical fiber connector.

(2) A fabrication method of an optical device mounted substrate assembly including: a ceramic substrate having a front surface and a first recess opened at least in the front surface;

an optical device mounted on the front surface of the ceramic substrate, having at least one of a light emitting portion and a light receiving portion, and optically connected to an optical waveguide or an optical fiber connector in a state that optical axes thereof are aligned with each other, a resin layer placed in the first recess, and having a second recess smaller in diameter than the first recess and opened at least in the front surface, and an alignment guide member fitted in the second recess and having a protruded portion protruding from the front surface of the ceramic substrate and fittingly engageable in an alignment hole of the optical waveguide or the optical fiber connector, the method characterized by having:

a first perforating step of forming the first recess in an unsintered ceramic product by machining;

a firing step of firing the unsintered ceramic product to form the ceramic substrate;

a resin layer forming step of forming the resin layer partially cured in the first recess;

a second perforating step of forming the second recess in the resin layer by machining after the resin layer forming step; and a full curing step of fully curing the resin layer after the second perforating step;

a finish machining step of finish machining the second recess after the full curing step;

an optical device mounting step of mounting the optical device after the finish machining step; and a guide member fitting step of fitting the alignment guide member in the second recess after the optical device mounting step.

(3) A substrate assembly for supporting an optical component equipped with another optical component characterized by including:

a substrate having a substrate side alignment recess;

a first optical component having at least a light reflecting function, and having a first optical component side alignment recess:

a second optical component disposed between the substrate and the first optical component, having at least a light condensing function, and having a second optical component side alignment recess;

an optical device mounted on the substrate, having at least one of a light emitting portion and a light receiving portion, and optically connected to the optical components in a state that optical axes thereof are aligned with each other; and an alignment guide member fittingly engageable in the first optical component side alignment recess, the second optical component side alignment recess, and the substrate side alignment recess.

(4) A substrate assembly for supporting an optical component equipped with another optical component characterized by including:

a ceramic substrate having a front surface and a first recess opened at least in the front surface;

a first optical component having at least a light reflecting function, and having a first optical component side alignment recess;

a second optical component disposed between the substrate and the first optical component, having at least a light condensing function, and having a second optical component side alignment recess;

an optical device mounted on the front surface of the ceramic substrate, having at least one of a light emitting portion and a light receiving portion, and optically connected to the optical components in a state that optical axes thereof are aligned with each other;

a resin layer placed in the first recess, and having a second recess smaller in diameter than the first recess and opened at least in the front surface; and an alignment guide member fittingly engageable in the first optical component side alignment recess, the second optical component side alignment recess, and the second recess being a substrate side alignment recess.

(5) The substrate assembly for supporting an optical component equipped with another optical component according to (3) or (4), characterized in that the first optical component is an optical fiber connector that is connected to an end of an optical fiber and has an optical path switching part.

(6) A fabrication method of an optical device mounted substrate assembly including: a ceramic substrate having a front surface and a first recess opened at least in the front surface; an optical device mounted on the front surface of the ceramic substrate, having at least one of a light emitting portion and a light receiving portion, and optically connected to an optical waveguide or with an optical fiber connector in a state that optical axes thereof are aligned with each other; a resin layer placed in the first recess, and having a second recess smaller in diameter than the first recess and a part thereof opened at least in the front surface; and an alignment guide member fitted in the second recess and having a protruded portion protruding from the front surface of the ceramic substrate and fittingly engageable in an alignment hole of the optical waveguide or the optical fiber connector, the method characterized by having:

a first perforating step of forming the first recess in an unsintered ceramic product by machining;

a firing step of firing the unsintered ceramic product to form the ceramic substrate;

a resin layer forming step and a second perforating step of disposing a spacer member in the first recess, filling and curing an uncured resin material in this state, and then removing the spacer member to form the resin layer having the second recess; and a guide member fitting step of fitting the alignment guide member in the second recess.

(7) A fabrication method of an optical device mounted substrate assembly including: a ceramic substrate having a front surface and a first recess opened at least in the front surface; an optical device mounted on the front surface of the ceramic substrate, having at least one of a light emitting portion and a light receiving portion, and optically connected to an optical waveguide or with an optical fiber connector in a state that optical axes thereof are aligned with each other; a resin layer placed in the first recess, and having a second recess smaller in diameter than the first recess and opened at least in the front surface; and an alignment guide member fitted in the second recess and having a protruded portion protruding from the front surface of the ceramic substrate and fittingly engageable in an alignment hole of the optical waveguide or the optical fiber connector, the method characterized by having:

a first perforating step of forming the first recess in an unsintered ceramic product;

a firing step of firing the unsintered ceramic product to form the ceramic substrate; and a resin layer forming and a guide member mounting step of holding the alignment guide member so that a portion of the alignment guide member is position within the first recess, filling an uncured resin material in the first recess and curing the resin material thereby forming the resin layer having the second recess and fittingly mounting the alignment guide member in the second recess.

(8) A photoelectric composite circuit structure characterized by including:

an optical device mounted substrate assembly having an optical device mounted substrate assembly main body formed with an optical device mounted substrate assembly side alignment recess, and an optical device mounted on the optical device mounted substrate assembly main body and having at least one of a light emitting portion and a light receiving portion;

an electric circuit board having an electric circuit board main body formed with an electric circuit board side alignment recess;

optical waveguide layer having an optical waveguide layer main body formed with an optical waveguide layer side alignment recess, a core formed in the optical waveguide layer main body, and a cladding formed in the optical waveguide layer main body for surrounding the core;

an optical path switching component made of an optically transparent material, and having an optical path switching component main body formed with an optical path switching component side alignment recess; and an alignment guide member fittingly engageable in the optical device mounted substrate assembly side alignment recess, the electric circuit board side alignment recess, the optical waveguide layer side alignment recess, and the optical path switching component side alignment recess.

(9) The photoelectric composite circuit structure according to (8), characterized in that the optical path switching component further has a light reflector formed on the optical path switching component main body.

(10) The photoelectric composite circuit structure according to (9), characterized by further including:

a microlens array having a microlens array main body formed with a microlens array side alignment recess, and a microlens made of an optically transparent material and formed on the microlens array main body, wherein the alignment guide member is fittingly engageable in the microlens array side alignment recess.

(11) A structure formed of an optical device mounted substrate assembly, an optical waveguide layer, and an optical path switching component characterized by including:

the optical device mounted substrate assembly having an optical device mounted substrate assembly main body formed with an optical device mounted substrate assembly side alignment recess, and an optical device mounted on the optical device mounted substrate assembly main body and having at least one of a light emitting portion and a light receiving portion;

the optical waveguide layer having an optical waveguide layer main body formed with an optical waveguide layer side alignment recess, a core formed in the optical waveguide layer main body, and a cladding formed in the optical waveguide layer main body for surrounding the core;

the optical path switching component made of an optically transparent material, and having an optical path switching component main body formed with an optical path switching component side alignment recess; and an alignment guide member fittingly engageable in to the optical device mounted substrate assembly side alignment recess, the optical waveguide layer side alignment recess, and the optical path switching component side alignment recess.

The entire contents of Japanese Patent Applications P2003-045469 (filed Feb. 24, 2003), P2003-185881 (filed Jun. 27, 2003), P2003-313626 (filed Sep. 5, 2003) and P2003-383391 (filed Nov. 13, 2003) are incorporated herein by reference.

Although the invention has been described above by reference to a certain embodiment of the invention, the invention is not limited to the embodiment described above. Modifications and variations of the embodiment described above will occur to those skilled in the art, in light of the above teachings. The scope of the invention is defined with reference to the following claims.

What is claimed is:

1. An optical device mounted substrate assembly comprising:
    a ceramic substrate having a front surface and a first recess having an open end at least at the front surface;
    an optical device mounted on the front surface of the ceramic substrate and having at least one of a light emitting portion and a light receiving portion, the optical device capable of being optically connected to one of an optical waveguide and an optical fiber connector in a way as to align optical axes of the optical device and one of the optical waveguide and the optical fiber connector with each other;
    a resin layer disposed in the first recess and having a second recess smaller in diameter than the first recess and having an open end at least at a side corresponding to the front surface; and
    an alignment guide member press-fitted in the second recess and having a protruded portion protruding from the front surface of the ceramic substrate and fittingly engageable in an alignment hole of one of the optical waveguide and the optical fiber connector,
    wherein the second recess is a high-precision machined hole, and the alignment guide member includes a guide pin fitted in the high-precision machined hole; and
    wherein the resin layer contains an inorganic filler having a thermal conductivity higher than that of a resin material forming the resin layer.

2. An optical device mounted substrate assembly according to claim 1, wherein the ceramic substrate comprises two first recesses each having the resin layer formed with the second recess, the optical device being disposed between the second recesses.

3. An optical device mounted substrate assembly according to claim 1, wherein the ceramic substrate comprises at the front surface thereof a positioning reference portion that serves as a reference for positioning of the optical device and for forming the second recess.

4. An optical device mounted substrate assembly according to claim 1, wherein the optical device is positioned with reference to the second recess.

5. A fabrication method of an optical device mounted substrate assembly including a ceramic substrate having a front surface and a first recess having an open end at least at the front surface, an optical device mounted on the front surface of the ceramic substrate and having at least one of a light emitting portion and a light receiving portion, the optical device capable of being optically connected to one of an optical waveguide and an optical fiber connector in a way as to align optical axes of the optical device and one of the optical waveguide and the optical fiber connector with each other, a resin layer disposed in the first recess and having a second recess smaller in diameter than the first recess and having an open end at least at a side corresponding to the front surface, and an alignment guide member fitted in the second recess and having a protruded portion protruding from the front surface of the ceramic substrate and fittingly engageable in an alignment hole of one of the optical waveguide and the optical fiber connector, the method comprising:
    a first perforating step of forming the first recess in an unsintered ceramic product by machining;
    a firing step of firing the unsintered ceramic product to form the ceramic substrate;
    a resin layer forming step of forming the resin layer in the first recess;
    a curing step of curing the resin layer;
    a second perforating step of forming the second recess in the resin layer by machining after the curing step; and
    a guide member fitting step of fitting the alignment guide member in the second recess.

6. A fabrication method according to claim 5, wherein the first perforating step and the second perforating step comprise forming the first recess and the second recess so that the inner diameter of the first recess after the firing step is larger than the inner diameter of the second recess and the outer diameter of the alignment guide member.

7. A fabrication method according to claim 5, wherein the second perforating step comprises forming the second recess by high-precision machining.

8. A fabrication method according to claim 5, wherein the resin layer forming step comprises filling an uncured resin material in the first recess and curing the resin material.

9. A fabrication method according to claim 8, wherein the resin layer forming step comprises using, as the uncured resin material to be filled in the first recess, an uncured resin material containing an inorganic filler having a thermal conductivity higher than that of a resin material forming the resin layer.

10. An optical waveguide equipped optical device mounted substrate assembly comprising:
    an optical waveguide;
    a ceramic substrate having a front surface and a first recess having an open end at least at the front surface;
    an optical device mounted on the front surface of the ceramic substrate and having at least one of a light emitting portion and a light receiving portion, the optical device being optically connected to the optical waveguide in a way as to align optical axes of the optical device and the optical waveguide with each other;
    a resin layer disposed in the first recess and having a second recess smaller in diameter than the first recess and having an open end at least at a side corresponding to the front surface; and
    an alignment guide member press-fitted in the second recess and having a protruded portion protruding from the front surface of the ceramic substrate and fittingly engageable in an alignment hole of the optical waveguide, and
    wherein the second recess is a high-precision machined hole, and the alignment guide member includes a guide pin fitted in the high-precision machined hole; and
    wherein the resin layer contains an inorganic filler having a thermal conductivity higher than that of a resin material forming the resin layer.

11. An optical fiber connector equipped optical device mounted substrate assembly comprising:
    an optical fiber connector;
    a ceramic substrate having a front surface and a first recess having an open end at least at the front surface;
    an optical device mounted on the front surface of the ceramic substrate and having at least one of a light emitting portion and a light receiving portion, the optical device being optically connected to the optical fiber connector in a way as to align optical axes of the optical device and the optical fiber connector with each other;

a resin layer disposed in the first recess and having a second recess smaller in diameter than the first recess and having an open end at least at a side corresponding to the front surface; and an alignment guide member press-fitted in the second recess and having a protruded portion protruding from the front surface of the ceramic substrate and fittingly engageable in an alignment hole of the optical fiber connector;

wherein the second recess is a high-precision machined hole, and the alignment guide member includes a guide pin fitted in the high-precision machined hole; and wherein the resin layer contains an inorganic filler having a thermal conductivity higher than that of a resin material forming the resin layer.

12. A fabrication method of an optical waveguide equipped optical device mounted substrate assembly including an optical waveguide, a ceramic substrate having a front surface and a first recess having an open end at least at the front surface, an optical device mounted on the front surface of the ceramic substrate and having at least one of a light emitting portion and a light receiving portion, the optical device being optically connected to the optical waveguide in a way as to align optical axes of the optical device and the optical waveguide with each other, a resin layer disposed in the first recess and having a second recess smaller in diameter than the first recess and having an open end at least at a side corresponding to the front surface, and an alignment guide member press-fitted in the second recess and having a protruded portion protruding from the front surface of the ceramic substrate and fittingly engageable in an alignment hole of the optical waveguide, and wherein the second recess is a high-precision machined hole, and the alignment guide member includes a guide pin fitted in the high-precision machined hole; and wherein the resin layer contains an inorganic filler having a thermal conductivity higher than that of a resin material forming the resin layer, the method comprising:

an alignment hole forming step of forming the alignment hole in the optical waveguide;

a first perforating step of forming the first recess in an unsintered ceramic product by machining;

a firing step of firing the unsintered ceramic product to form the ceramic substrate;

a resin layer forming step of forming the resin layer in the first recess;

a curing step of curing the resin layer;

a second perforating step of forming the second recess in the resin layer by machining after the curing step;

a guide member fitting step of fitting the alignment guide member in the second recess; and an alignment step of aligning the optical axes of the optical waveguide and the optical device with each other by fitting the alignment guide member in the alignment hole.

13. A fabrication method of an optical fiber connector equipped optical device mounted substrate assembly including an optical fiber connector, a ceramic substrate having a front surface and a first recess having an open end at least at the front surface, an optical device mounted on the front surface of the ceramic substrate and having at least one of a light emitting portion and a light receiving portion, the optical device being optically connected to the optical fiber connector in a way as to align optical axes of the optical device and the optical fiber connector with each other, a resin layer disposed in the first recess and having a second recess smaller in diameter than the first recess and having an open end at least at a side corresponding to the front surface, and an alignment guide member fitted in the second recess and having a protruded portion protruding from the front surface of the ceramic substrate and fittingly engageable in an alignment hole of the optical fiber connector, the method comprising:

an alignment hole forming step of forming the alignment hole in the optical fiber connector;

a first perforating step of forming the first recess in an unsintered ceramic product by machining;

a firing step of firing the unsintered ceramic product to form the ceramic substrate;

a resin layer forming step of forming the resin layer in the first recess;

a curing step of curing the resin layer;

a second perforating step of forming the second recess in the resin layer by machining after the curing step;

a guide member fitting step of fitting the alignment guide member in the second recess; and an alignment step of aligning the optical axes of the optical fiber connector and the optical device with each other by fittingly engaging the alignment guide member in the alignment hole.

* * * * *